United States Patent
Drazba et al.

(10) Patent No.: US 11,905,423 B2
(45) Date of Patent: Feb. 20, 2024

(54) BLOCKED SILICONE DUAL CURE RESINS FOR ADDITIVE MANUFACTURING

(71) Applicant: Carbon, Inc., Redwood City, CA (US)

(72) Inventors: Jessica D. Drazba, Redwood City, CA (US); Kai Chen, Sunnyvale, CA (US); Jason P. Rolland, San Carlos, CA (US)

(73) Assignee: Carbon, Inc., Redwood City, CA (US)

( * ) Notice: Subject to any disclaimer, the term of this patent is extended or adjusted under 35 U.S.C. 154(b) by 686 days.

(21) Appl. No.: 16/947,914

(22) Filed: Aug. 24, 2020

(65) Prior Publication Data
US 2020/0377745 A1  Dec. 3, 2020

Related U.S. Application Data

(62) Division of application No. 16/061,205, filed as application No. PCT/US2016/067985 on Dec. 21, 2016, now Pat. No. 10,787,583.

(60) Provisional application No. 62/270,651, filed on Dec. 22, 2015.

(51) Int. Cl.

| | |
|---|---|
| *C09D 11/101* | (2014.01) |
| *C09D 11/102* | (2014.01) |
| *C09D 11/037* | (2014.01) |
| *C08G 18/10* | (2006.01) |
| *C08G 18/63* | (2006.01) |
| *C08G 18/77* | (2006.01) |
| *B33Y 70/00* | (2020.01) |
| *G03F 7/075* | (2006.01) |
| *G03F 7/037* | (2006.01) |
| *B29C 64/124* | (2017.01) |
| *G03F 7/027* | (2006.01) |
| *B29C 64/188* | (2017.01) |
| *B33Y 40/20* | (2020.01) |
| *C09D 4/00* | (2006.01) |
| *B33Y 10/00* | (2015.01) |
| *B29C 64/135* | (2017.01) |
| *B29K 75/00* | (2006.01) |
| *B29K 83/00* | (2006.01) |
| *B29K 96/04* | (2006.01) |
| *B29K 105/00* | (2006.01) |
| *B29C 35/08* | (2006.01) |
| *B33Y 70/10* | (2020.01) |

(52) U.S. Cl.
CPC .......... *C09D 11/101* (2013.01); *B29C 64/124* (2017.08); *B29C 64/188* (2017.08); *B33Y 40/20* (2020.01); *B33Y 70/00* (2014.12); *C08G 18/10* (2013.01); *C08G 18/638* (2013.01); *C08G 18/778* (2013.01); *C09D 4/00* (2013.01); *C09D 11/037* (2013.01); *C09D 11/102* (2013.01); *G03F 7/027* (2013.01); *G03F 7/037* (2013.01); *G03F 7/0755* (2013.01); *G03F 7/0757* (2013.01); *B29C 64/135* (2017.08); *B29C 2035/0855* (2013.01); *B29K 2075/00* (2013.01); *B29K 2083/00* (2013.01); *B29K 2096/04* (2013.01); *B29K 2105/0002* (2013.01); *B29K 2105/0085* (2013.01); *B33Y 10/00* (2014.12); *B33Y 70/10* (2020.01)

(58) Field of Classification Search
CPC ...... C09D 11/101; C09D 4/00; C09D 11/037; C09D 11/102; B29C 64/124; B29C 64/188; B29C 64/135; B29C 2035/0855; B33Y 40/20; B33Y 70/00; B33Y 10/00; B33Y 70/10; C08G 18/10; C08G 18/638; C08G 18/778; G03F 7/037; G03F 7/0755; G03F 7/0757; B29K 2075/00; B29K 2083/00; B29K 2096/04; B29K 2105/0002; B29K 2105/0085
See application file for complete search history.

(56) References Cited

U.S. PATENT DOCUMENTS

| | | | |
|---|---|---|---|
| 4,173,682 | A | 11/1979 | Noomen et al. |
| 5,063,254 | A | 11/1991 | Nakos |
| 5,082,590 | A | 1/1992 | Araud |
| 5,236,637 | A | 8/1993 | Hull |
| 5,264,061 | A | 11/1993 | Juskey et al. |
| 5,391,072 | A | 2/1995 | Lawton et al. |
| 5,418,112 | A | 5/1995 | Mirle et al. |
| 5,498,782 | A | 3/1996 | Rex |
| 5,529,473 | A | 6/1996 | Lawton et al. |
| 5,629,133 | A | 5/1997 | Wolf et al. |

(Continued)

FOREIGN PATENT DOCUMENTS

| | | |
|---|---|---|
| CN | 103571211 | 2/2012 |
| EP | 0442071 | 8/1991 |

(Continued)

OTHER PUBLICATIONS

International Search Report and Written Opinion, PCT/US2016/067985, dated May 23, 2017, 10 pages.

(Continued)

*Primary Examiner* — Jessica M Roswell
(74) *Attorney, Agent, or Firm* — Myers Bigel, P.A.

(57) ABSTRACT

A polymerizable liquid useful for the production of a three-dimensional object comprised of silicone, or a copolymer thereof, which includes at least one constituent selected from the group consisting of (i) a blocked or reactive blocked siloxane-containing prepolymer, (ii) a blocked or reactive blocked siloxane-containing polyisocyanate, and (iii) a blocked or reactive blocked siloxane-containing polyisocyanate chain extender. Methods of using the same in additive manufacturing processes such as continuous liquid interface production are also described.

29 Claims, No Drawings

(56) References Cited

U.S. PATENT DOCUMENTS

| | | |
|---|---|---|
| 5,674,921 A | 10/1997 | Regula et al. |
| 5,679,719 A | 10/1997 | Klemarczyk et al. |
| 5,695,708 A | 12/1997 | Karp et al. |
| 6,309,797 B1 | 10/2001 | Grinevich et al. |
| 6,391,999 B1 | 5/2002 | Crivello |
| 7,438,846 B2 | 10/2008 | John |
| 7,807,744 B2 | 10/2010 | Barnes et al. |
| 7,892,474 B2 | 2/2011 | Shkolnik et al. |
| 8,008,420 B2 | 8/2011 | Zhu |
| 8,084,532 B2 | 12/2011 | Fisher et al. |
| 8,088,449 B2 | 1/2012 | Bailey et al. |
| 8,110,135 B2 | 2/2012 | El-Siblani |
| 9,205,601 B2 | 12/2015 | Desimone et al. |
| 9,211,678 B2 | 12/2015 | Desimone et al. |
| 9,216,546 B2 | 12/2015 | Desimone et al. |
| 9,453,142 B2 | 9/2016 | Rolland et al. |
| 9,598,606 B2 | 3/2017 | Rolland et al. |
| 9,676,963 B2 | 6/2017 | Rolland et al. |
| 9,708,440 B2 | 7/2017 | Das et al. |
| 9,777,097 B2 | 10/2017 | Liu et al. |
| 9,982,164 B2 | 5/2018 | Rolland et al. |
| 10,155,882 B2 | 12/2018 | Rolland et al. |
| 10,240,066 B2 | 3/2019 | Rolland et al. |
| 2002/0056945 A1 | 5/2002 | Gelbart |
| 2003/0091833 A1 | 5/2003 | Baumgart et al. |
| 2004/0014832 A1 | 1/2004 | Baudin et al. |
| 2004/0052966 A1 | 3/2004 | Wilke et al. |
| 2004/0187714 A1 | 9/2004 | Napadensky |
| 2005/0196626 A1* | 9/2005 | Knox .................. C09K 9/02 428/447 |
| 2007/0075458 A1 | 4/2007 | Wahlstrom et al. |
| 2007/0178133 A1 | 8/2007 | Rolland |
| 2007/0205528 A1 | 9/2007 | Patel et al. |
| 2008/0131692 A1 | 6/2008 | Rolland et al. |
| 2010/0093902 A1* | 4/2010 | Horstman .............. C08G 18/61 525/452 |
| 2010/0105794 A1 | 4/2010 | Dietliker et al. |
| 2010/0125356 A1 | 5/2010 | Shkolnik et al. |
| 2012/0007287 A1 | 1/2012 | Vermeer et al. |
| 2012/0195994 A1 | 8/2012 | El-Siblani et al. |
| 2013/0292862 A1 | 11/2013 | Joyce |
| 2013/0295212 A1 | 11/2013 | Chen et al. |
| 2015/0277008 A1* | 10/2015 | Huh .................... G02B 5/3033 428/212 |
| 2015/0322291 A1 | 11/2015 | Salviato et al. |
| 2018/0244854 A1 | 8/2018 | Drazba et al. |

FOREIGN PATENT DOCUMENTS

| | | |
|---|---|---|
| EP | 0525578 | 2/1993 |
| EP | 0562826 | 9/1993 |
| EP | 0830641 | 3/1998 |
| EP | 1341039 | 9/2003 |
| EP | 1757979 | 2/2007 |
| EP | 1918316 | 5/2008 |
| EP | 2224874 | 9/2010 |
| JP | H02111528 | 4/1990 |
| JP | H09194540 | 7/1997 |
| JP | 2000007641 | 1/2000 |
| WO | 92/07705 | 5/1992 |
| WO | 96/00412 | 1/1996 |
| WO | 2001/026023 | 4/2001 |
| WO | 2006/045002 | 4/2006 |
| WO | 2015/077419 | 5/2015 |
| WO | 2015/142546 | 9/2015 |
| WO | 2015/164234 | 10/2015 |
| WO | 2016/133759 | 8/2016 |
| WO | 2016/145182 | 9/2016 |

OTHER PUBLICATIONS

Malik et al. "A thermally reworkable UV curable acrylic adhesive prototype" International Journal of Adhesion & Adhesives, 22: 283-289 (2002).

Malik et al. "Comparative Study of Novel Polymer Prototype for Controlled Thermally Reworkable UV Curable Acrylic Adhesives in Absence and Presence of Reactive Diluent" Surface Engineering, 19(2): 121-126 (2003).

Malik et al. "Computational study of thermally controlled polymer network disassembly via the incorporation of sterically hindered urea linkages" Polymer, 43: 2561-2567 (2002).

Malik et al. "The thermally controlled molecular disassembly properties of a polymer network via the incorporation of one sterically hindered urea linkage" Polymer Degradation and Stability, 76: 241-249 (2002).

Malik et al. "Thermally Controlled Molecular Disassembly of a Crosslinked Polymer Network by the Incorporation of Sterically Hindered Urea Linkages" Journal of Applied Polymer Science, 85: 856-864 (2002).

Pan et al. "A Fast Mask Projection Stereolithography Process for Fabricating Digital Models in Minutes", J. Manufacturing Sci. and Eng. 134(5):051011-1 (2012).

Park et al. "UV- and thermal-curing behaviors or dual-curable adhesives based on epoxy acrylate oligomers" International Journal of Adhesion and Adhesives, 29(7): 710-717 (2009).

Tumbleston et al. "Continuous Liquid Interface Production of 3D Objects", Science, 347:1349-1352 (2015).

Velankar et al. "High-performance UV-curable urethane acrylates via deblocking chemistry" Journal of Applied Polymer Science, 62(9):1361-1376 (1996).

* cited by examiner

BLOCKED SILICONE DUAL CURE RESINS FOR ADDITIVE MANUFACTURING

RELATED APPLICATIONS

This application is a divisional of U.S. patent application Ser. No. 16/061,205, filed Jun. 11, 2018, which is a 35 U.S.C. § 371 national phase entry of PCT Application PCT/US2016/067985, filed Dec. 21, 2016, and published in English on Jun. 29, 2017, as International Publication No. WO 2017/112751, and which claims the benefit of U.S. Provisional Application Ser. No. 62/270,651, filed Dec. 22, 2015, the disclosure of each of which is incorporated by reference herein in its entirety.

FIELD OF THE INVENTION

The present invention concerns materials, methods and apparatus for the fabrication of solid three-dimensional objects from liquid materials, and objects so produced.

BACKGROUND OF THE INVENTION

In conventional additive or three-dimensional fabrication techniques, construction of a three-dimensional object is performed in a step-wise or layer-by-layer manner. In particular, layer formation is performed through solidification of photo curable resin under the action of visible or UV light irradiation. Two techniques are known: one in which new layers are formed at the top surface of the growing object; the other in which new layers are formed at the bottom surface of the growing object. An early example is Hull, U.S. Pat. No. 5,236,637. Other approaches are shown in U.S. Pat. Nos. 7,438,846, 7,892,474; M. Joyce, U.S. Patent App. 2013/0292862; Y. Chen et al., U.S. Patent App. 2013/0295212 (both Nov. 7, 2013); Y. Pan et al., *J. Manufacturing Sci. and Eng.* 134, 051011-1 (October 2012), and numerous other references. Materials for use in such apparatus are generally limited, and there is a need for new resins which will provide diverse material properties for different product families if three-dimensional fabrication is to achieve its full potential.

SUMMARY OF THE INVENTION

In general, in the present invention, a method of forming a three-dimensional object comprised of a silicone polymer or a copolymer thereof is carried out by:
(a) providing a carrier, a fill level, and optionally an optically transparent member having a build surface, the carrier and the fill level defining a build region therebetween (and the build surface defining the fill level when present);
(b) filling the build region with a polymerizable liquid (or "resin"), the polymerizable liquid comprising at least one of: (i) a blocked or reactive blocked siloxane-containing prepolymer, (ii) a blocked or reactive blocked siloxane-containing polyisocyanate, or (iii) a blocked or reactive blocked siloxane-containing polyisocyanate chain extender;
(c) irradiating the build region with light (through the optically transparent member when present) to form a solid blocked polymer scaffold and advancing the carrier away from the build surface to form a three-dimensional intermediate having the same shape as, or a shape to be imparted to, the three-dimensional object, with the intermediate containing the chain extender; then
(d) optionally washing the three-dimensional intermediate; and then
(e) heating or microwave irradiating the three-dimensional intermediate sufficiently to form from the three-dimensional intermediate the three-dimensional object comprised of the silicone polymer or copolymer.

In some embodiments, the polymerizable liquid comprises a mixture of (i) a blocked or reactive blocked prepolymer, (ii) a chain extender, (iii) a photoinitiator, (iv) optionally a polyol and/or a polyamine, (v) optionally a reactive diluent, (vi) optionally a pigment or dye, and (vii) optionally a filler; wherein at least one, two, three, or all of the a blocked or reactive blocked prepolymer, the chain extender, the polyol and/or a polyamine, or (less preferably) the reactive diluent, is siloxane-containing.

In some embodiments, the polymerizable liquid comprises a mixture of (i) a blocked or reactive blocked polyisocyanate, (ii) a chain extender, (iii) a photoinitiator, (iv) optionally a polyol and/or polyamine, (v) optionally a reactive diluent, (vi) optionally a pigment or dye, and (vii) optionally a filler; and wherein at least one, two, three, or all of the blocked polyisocyanate, the polyol and/or polyamine, the chain extender, or (less preferably) the reactive diluent, is siloxane-containing.

In some embodiments, the polymerizable liquid comprises a mixture of (i) a polyol and/or polyamine, (ii) a blocked or reactive blocked polyisocyanate chain extender, (iii) optionally one or more additional chain extenders, (iv) a photoinitiator, (v) optionally a reactive diluent, (vi) optionally a pigment or dye, and (vii) optionally a filler, and wherein at least one, two, three, or all of the polyol and/or polyamine, the blocked or reactive blocked polyisocyanate chain extender, the one or more additional chain extender, and (less preferably) the reactive diluent, is siloxane-containing.

In some embodiments, the three-dimensional object comprises (i) a linear thermoplastic polyurethane, polyurea, or copolymer thereof, (ii) a cross-linked thermoset polyurethane, polyurea, or copolymer thereof, or (iii) combinations thereof, optionally blended with de-blocked blocking group which is copolymerized with the reactive diluent(s).

Resins useful for carrying out such methods, and products produced from such methods, are also described.

In some embodiments of the methods and compositions described above and below, the polymerizable liquid (or "dual cure resin") has a viscosity of 100, 200, 500 or 1,000 centipoise or more at room temperature and/or under the operating conditions of the method, up to a viscosity of 10,000, 20,000, or 50,000 centipoise or more, at room temperature and/or under the operating conditions of the method.

In particular embodiments, the step of forming the three-dimensional intermediate is carried out by additive manufacturing, such as by "top-down" or "bottom-up" additive manufacturing. In some preferred embodiments, the step of forming the three-dimensional intermediate is carried out by continuous liquid interface production (CLIP).

Resins useful for carrying out the methods, and products produced thereby, are also described herein.

In some embodiments, the product or three-dimensional object produced comprises a polymer blend, interpenetrating polymer network, semi-interpenetrating polymer network, or sequential interpenetrating polymer network.

Non-limiting examples and specific embodiments of the present invention are explained in greater detail in the specification set forth below. The disclosures of all United States Patent references cited herein are to be incorporated herein by reference in their entirety.

DETAILED DESCRIPTION OF ILLUSTRATIVE EMBODIMENTS

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

As used herein, the term "and/or" includes any and all possible combinations or one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly-used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

"Shape to be imparted to" refers to the case where the shape of the intermediate object slightly changes between formation thereof and forming the subsequent three-dimensional product, typically by shrinkage (e.g., up to 1, 2 or 4 percent by volume), expansion (e.g., up to 1, 2 or 4 percent by volume), removal of support structures, or by intervening forming steps (e.g., intentional bending, stretching, drilling, grinding, cutting, polishing, or other intentional forming after formation of the intermediate product, but before formation of the subsequent three-dimensional product).

"Diisocyanate" and "polyisocyanate" are used interchangeably herein and refer to aliphatic, cycloaliphatic, aromatic, optionally siloxane containing, isocyanates that have at least 2, or in some embodiments more than 2, isocyanate (NCO) groups per molecule, on average. In some embodiments, the isocyanates have, on average, 3 to 6, 8 or 10 or more isocyanate groups per molecule. In some embodiments, the isocyanates may be a hyperbranched or dendrimeric isocyanate (e.g., containing more than 10 isocyanate groups per molecule, on average). Common examples of suitable isocyanates include, but are not limited to, methylene diphenyl diisocyanate (MDI), toluene diisocyanate (TDI)), para-phenyl diisocyanate (PPDI), 4,4'-dicyclohexylmethane-diisocyanate (HMDI), hexamethylene diisocyanate (HDI), isophorone diisocyanate (IPDI), triphenylmethane-4,4'4"-triisocyanate, tolune-2,4,6-triyl triisocyanate, 1,3,5-triazine-2,4,6-triisocyanate, ethyl ester L-lysine triisocyanate, etc., including combinations thereof. Numerous additional examples are known and are described in, for example, U.S. Pat. Nos. 9,200,108; 8,378,053; 7,144,955; 4,075,151, 3,932,342, and in U.S. Patent Application Publication Nos. US 20040067318 and US 20140371406, the disclosures of all of which are incorporated by reference herein in their entirety.

1. Resins.

"Silicone polymer" as used herein includes both (i) polymers in which the backbone is entirely silicone (typically, a series of Si—O—Si linkages) also referred to as siloxane polymers, and (ii) polymers in which the backbone contains one or more carbons, also referred to as "organosilane polymers." The silicone polymers may optionally be in the form of copolymers, with other silicone polymers, or with organic polymers. Reactants themselves may be silicone polymers (including short polymers, also referred to as "oligomers") that contain further reactive groups as discussed below.

The "silicone polymer" may comprise four different types of functional siloxane monomeric units, depending on whether the silicon atoms have one, two, three, or four oxygen linkages, and are typically designated M, D, T, or Q, respectively. The functional siloxane monomeric units may be included in the resin as monomers, oligomers and/or polymers thereof. The resin may contain the different monomeric units independently or in combination with one another—e.g., as oligomeric units (although note that a network of only Q groups becomes fused quartz). Thus examples of "silicone polymers" for use in the present thus include, but are not limited to, those comprising an MM resin, an MD resin, a DT resin, an MT resin, an MDT resin, a DTQ resin, an MTQ resin, an MDTQ resin, a DQ resin, an MQ resin, a DTQ resin, an MTQ resin, or an MDQ resin. See, e.g., U.S. Pat. Nos. 8,088,449; 8,084,532; 8,008,420; 7,807,744; 5,082,590; and 5,063,254.

In some embodiments, the photoinitiator comprises an organic small molecule, oligomer or polymer that absorbs UV light and/or visible light in the range of 200-500 nm (e.g., a benzyl ketal, hydroxyacetophenone, alkylaminoacetophenone, phosphine oxide, benzophenone, substituted benzophenone, thioxanthone, anthraquinone, and/or camphorquinone). Additional tertiary amine synergists (e.g., alkylamines, alkanolamines, ethanolamines (such as methyldiethanolamine, triethanol amine or dimethylethanolamine), or aminobenzoates (esters such as ethyl p-dimethylaminobenzoate or 2-ethylhexyl 4-aminobenzoate)) or hydrogen donors (e.g., an alcohol, ether, or thiol) may be included.

As noted above, and as discussed in further detail below, the present invention provides a polymerizable liquid useful for the production of a three-dimensional object comprised of silicone or a copolymer thereof by additive manufacturing, the polymerizable liquid comprising a mixture of: (a) at least one constituent selected from the group consisting of (i) a blocked or reactive blocked siloxane-containing prepolymer, (ii) a blocked or reactive blocked siloxane-containing polyisocyanate, and (iii) a blocked or reactive blocked siloxane-containing polyisocyanate chain extender; (b) optionally at least one additional chain extender, which is optionally siloxane containing; (c) a photoinitiator; (d) optionally a polyol and/or a polyamine, which is optionally siloxane-containing; (e) optionally a reactive diluent, which is optionally siloxane-containing; (f) optionally at least one non-reactive light absorbing pigment or dye which when present is included in an amount of from 0.001 to 10 percent by weight, and (g) optionally a filler.

In some embodiments, the polymerizable liquid comprises: from 5 to 90 percent by weight of the blocked or reactive blocked prepolymer; optionally, from 0 or 0.01 to 40 percent by weight of the reactive diluent; from 5 to 30 or 50 or 90 percent by weight of the chain extender; from 0.01 or 0.1 to 4 percent by weight of the photoinitiator, and from 1 to 50 percent filler, when present.

In some embodiments, the polymerizable liquid comprises: from 5 to 90 percent by weight of the blocked or reactive blocked polyisocyanate; from 5 to 90 percent by weight of the polyol or polyamine; optionally, from 0 or 0.01 to 40 percent by weight of the reactive diluent; from 5 to 30 or 50 or 90 percent by weight of the chain extender; and from 0.01 or 0.1 to 4 percent by weight of the photoinitiator; from 0.1 to 2 percent pigment when present, and from 1 to 50 percent filler, when present.

In some embodiments, the polymerizable liquid comprises: from 5 to 90 percent by weight of the polyol or polyamine; from 5 to 90 percent by weight of the blocked or reactive blocked polyisocyanate chain extender; optionally, from 0 or 0.01 to 40 percent by weight of the reactive diluent; optionally from 5 to 30 or 50 or 90 percent by weight of the chain extender; and from 0.01 or 0.1 to 4 percent by weight of the photoinitiator; from 0.01 to 2 percent pigment when present, and from 1 to 50 percent filler, when present.

It will be appreciated that at least one, two, three, or all of the constituents will be siloxane-containing, as discussed further below.

In some embodiments, a Lewis acid or an oxidizable tin salt is included in the polymerizable liquid (e.g., in an amount of from 0.01 or 0.1 to 1 or 2 percent by weight, or more) in an amount effective to accelerate the formation of the three-dimensional intermediate object during the production thereof. Oxidizable tin salts useful for carrying out the present invention include, but are not limited to, stannous butanoate, stannous octoate, stannous hexanoate, stannous heptanoate, stannous linoleate, stannous phenyl butanoate, stannous phenyl stearate, stannous phenyl oleate, stannous nonanoate, stannous decanoate, stannous undecanoate, stannous dodecanoate, stannous stearate, stannous oleate, stannous undecenoate, stannous 2-ethylhexoate, dibutyl tin dilaurate, dibutyl tin dioleate, dibutyl tin distearate, dipropyl tin dilaurate, dipropyl tin dioleate, dipropyl tin distearate, dibutyl tin dihexanoate, and combinations thereof. See also U.S. Pat. Nos. 5,298,532; 4,421,822; and 4,389,514, the disclosures of which are incorporated herein by reference. In addition to the foregoing oxidizable tin salts, Lewis acids such as those described in Chu et al. in Macromolecular Symposia, Volume 95, Issue 1, pages 233-242, June 1995 are known to enhance the polymerization rates of free-radical polymerizations and are included herein by reference.

Any suitable filler may be used in connection with the present invention, depending on the properties desired in the part or object to be made. Thus, fillers may be solid or liquid, organic or inorganic, and may include reactive and non-reactive rubbers: reactive or non-reactive siloxanes, acrylonitrile-butadiene rubbers; reactive and non-reactive thermoplastics (including but not limited to: poly(ether imides), maleimide-styrene terpolymers, polyarylates, polysulfones and polyethersulfones, etc.), reactive or non-reactive inorganic fillers such as silicates (such as talc, clays, silica, mica), glass, carbon nanotubes, graphene, cellulose nanocrystals, etc., including combinations of all of the foregoing. Suitable fillers include tougheners, such as core-shell rubbers, as discussed below.

Tougheners. One or more polymeric and/or inorganic tougheners can be used as a filler in the present invention. See generally U.S. Patent Application Publication No. 20150215430. The toughener may be uniformly distributed in the form of particles in the cured product. The particles could be less than 5 microns (µm) in diameter. Such tougheners include, but are not limited to, those formed from elastomers, branched polymers, hyperbranched polymers, dendrimers, rubbery polymers, rubbery copolymers, block copolymers, core-shell particles, oxides or inorganic materials such as clay, polyhedral oligomeric silsesquioxanes (POSS), carbonaceous materials (e.g., carbon black, carbon nanotubes, carbon nanofibers, fullerenes), ceramics and silicon carbides, with or without surface modification or functionalization. Examples of block copolymers include the copolymers whose composition is described in U.S. Pat. No. 6,894,113 (Court et al., Atofina, 2005) and include "NANOSTRENTH®" SBM (polystyrene-polybutadiene-polymethacrylate), and AMA (polymethacrylate-polybutylacrylate-polymethacrylate), both produced by Arkema. Other suitable block copolymers include FORTEGRA™ and the amphiphilic block copolymers described in U.S. Pat. No. 7,820,760B2, assigned to Dow Chemical. Examples of known core-shell particles include the core-shell (dendrimer) particles whose compositions are described in US20100280151A1 (Nguyen et al., Toray Industries, Inc., 2010) for an amine branched polymer as a shell grafted to a core polymer polymerized from polymerizable monomers containing unsaturated carbon-carbon bonds, core-shell rubber particles whose compositions are described in EP 1632533A1 and EP 2123711A1 by Kaneka Corporation, and the "KaneAce MX" product line of such particle/epoxy blends whose particles have a polymeric core polymerized from polymerizable monomers such as butadiene, styrene, other unsaturated carbon-carbon bond monomer, or their combinations, and a polymeric shell compatible with the epoxy, typically polymethylmethacrylate, polyglycidylmethacrylate, polyacrylonitrile or similar polymers, as discussed further below. Also suitable as block copolymers in the present invention are the "JSR SX" series of carboxylated polystyrene/polydivinylbenzenes produced by JSR Corporation; "Kureha Paraloid" EXL-2655 (produced by Kureha Chemical Industry Co., Ltd.), which is a butadiene alkyl methacrylate styrene copolymer; "Stafiloid" AC-3355 and TR-2122 (both produced by Takeda Chemical Industries, Ltd.), each of which are acrylate methacrylate copolymers; and "PARALOID" EXL-2611 and EXL-3387 (both produced by Rohm & Haas), each of which are butyl acrylate methyl methacrylate copolymers. Examples of suitable oxide particles include NANOPDX® produced by nanoresins AG. This is a master blend of functionalized nanosilica particles and an epoxy. Additional examples of core-shell rubber tougheners include, but are not limited to, those described in, for example, US Patent Application Publication No. 20150184039, as well as U.S. Patent Application Publication No. 20150240113, and U.S. Pat. Nos. 6,861,475, 7,625,977, 7,642,316, 8,088,245, and elsewhere.

A. Dual hardening polymerizable liquids employing blocked prepolymers and thermally cleavable blocking groups. Some "dual cure" embodiments of the present invention are, in general, a method of forming a three-dimensional object, comprising:

(a) providing a carrier and an optically transparent member having a build surface, the carrier and the build surface defining a build region therebetween;

(b) filling the build region with a polymerizable liquid, the polymerizable liquid comprising a mixture of a blocked or reactive blocked prepolymer, optionally but in some embodiments preferably a reactive diluent, a chain extender, and a photoinitiator;

(c) irradiating the build region with light through the optically transparent member to form a (rigid, compressible, collapsible, flexible or elastic) solid blocked polymer scaffold from the blocked prepolymer and optionally the reactive diluent while concurrently advancing the carrier away from the build surface to form a three-dimensional intermediate having the same shape as, or a shape to be imparted to, the three-dimensional object, with the intermediate containing the chain extender; and then (d) heating or microwave irradiating the three-dimensional intermediate sufficiently to form the three-dimensional product from the three-dimensional intermediate (without wishing to be bound to any particular mechanism, the heating or microwave irradiating may cause the chain extender to react with the blocked or reactive blocked prepolymer or an unblocked product thereof).

In some embodiments, the blocked or reactive blocked prepolymer comprises a polyisocyanate.

In some embodiments, the blocked or reactive blocked prepolymer is a compound of the formula A-X-A, where X is a hydrocarbyl group, a siloxane group, or a mixed hydrocarbyl and siloxane group, and each A is an independently selected substituent of Formula X:

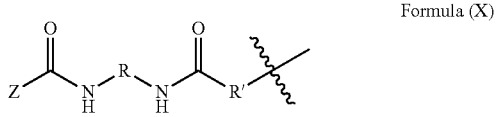

Formula (X)

where R is a hydrocarbyl group, R' is O or NH, and Z is a blocking group, the blocking group optionally having a reactive terminal group (e.g., a polymerizable end group such as an epoxy, alkene, alkyne, or thiol end group, for example an ethylenically unsaturated end group such as a vinyl ether).). In a particular example, each A is an independently selected substituent of Formula (XI):

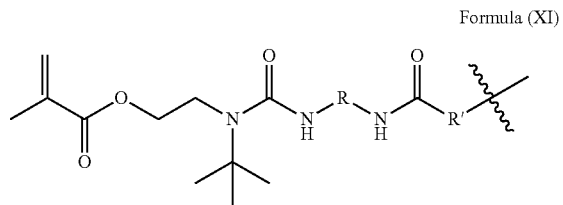

Formula (XI)

where R and R' are as given above.

In some embodiments, the blocked or reactive blocked prepolymer comprises a polyisocyanate oligomer produced by the reaction of at least one diisocyanate (e.g., a diisocyanate such as hexamethylene diisocyanate (HDI), bis-(4-isocyanatocyclohexyl)methane (HMDI), isophorone diisocyanate (IPDI), etc., a triisocyanate, etc.) with at least one polyol (e.g., a polyether or polyester or polybutadiene or polysiloxane diol).

In some embodiments, the reactive blocked prepolymer is blocked by reaction of a polyisocyanate with an amine (meth)acrylate monomer blocking agent (e.g., tertiary-butylaminoethyl methacrylate (TBAEMA), tertiary pentylaminoethyl methacrylate (TPAEMA), tertiary hexylaminoethyl methacrylate (THAEMA), tertiary-butylaminopropyl methacrylate (TBAPMA), acrylate analogs thereof, and mixtures thereof (see, e.g., U.S. Patent Application Publication No. 20130202392). Note that all of these can be used as diluents, as well.

There are many blocking agents for isocyanate. In preferred embodiments of the current invention, the blocking agent (e.g., TBAEMA), cures (e.g., from the actinic radiation or light) into the system. Those skilled in the art can couple (meth)acrylate groups to known blocking agents to create additional blocking agents that can be used to carry out the present invention. Still further, those skilled in the art can use maleimide, or substitute maleimide on other known blocking agents, for use in the present invention.

Examples of known blocking agents which can be substituted on or covalently coupled to (meth)acrylate or maleimide for use in the present invention include, but are not limited to, phenol type blocking agents (e.g., phenol, cresol, xylenol, nitrophenol, chlorophenol, ethyl phenol, t-butylphenol, hydroxy benzoic acid, hydroxy benzoic acid esters, 2,5-di-t-butyl-4-hydroxy toluene, etc.), lactam type blocking agents (e.g., ε-caprolactam, δ-valerolactam, γ-butyrolactam, β-propiolactam, etc.), active methylene type blocking agents (e.g., diethyl malonate, dimethyl malonate, ethyl acetoacetate, methyl acetoacetate, acetyl acetone, etc.), alcohol type blocking agents (e.g., methanol, ethanol, n-propanol, isopropanol, n-butanol, isobutanol, t-butanol, n-amyl alcohol, t-amyl alcohol, lauryl alcohol, ethylene glycol monomethyl ether, ethylene glycol monoethyl ether, ethylene glycol monobutyl ether, diethylene glycol monomethyl ether, diethylene glycol monoethyl ether, propylene glycol monomethyl ether, methoxyethanol, glycolic acid, glycolic acid esters, lactic acid, lactic acid ester, methylol urea, methylol melamine, diacetone alcohol, ethylene chlorohydrine, ethylene bromohydrine, 1,3-dichloro-2-propanol, ω-hydroperfluoro alcohol, acetocyanhydrine, etc.), mercaptan type blocking agents (e.g., butyl mercaptan, hexyl mercaptan, t-butyl mercaptan, t-dodecyl mercaptan, 2-mercapto-benzothiazole, thiophenol, methyl thiophenol, ethyl thiophenyl, etc.), acid amide type blocking agents (e.g., acetoanilide, acetoanisidine amide, acrylamide, methacrylamide, acetic amide, stearic amide, benzamide, etc.), imide type blocking agents (e.g., succinimide, phthalimide, maleimide, etc.), amine type blocking agents (e.g., diphenylamine, phenylnaphthylamine, xylidine, N-phenyl xylidine, carbazole, aniline, naphthylamine, butylamine, dibutylamine, butyl phenylamine, etc.), imidazole type blocking agents (e.g., imidazole, 2-ethylimidazole, etc.), urea type blocking agents (e.g., urea, thiourea, ethylene urea, ethylene thiourea, 1,3-diphenyl urea, etc.), carbamate type blocking agents (e.g., N-phenyl carbamic acid phenyl ester, 2-oxazolidone, etc.), imine type blocking agents (e.g., ethylene imine, etc.), oxime type blocking agents (e.g., formaldoxime, acetaldoximine, acetoxime, methylethyl ketoxime, diacetylomonoxime, benzophenoxime, cyclohexanonoxime, etc.) and sulfurous acid salt type blocking agents (e.g., sodium bisulfite, potassium bisulfite, etc.). Of these, use is preferably made of the phenol type, the lactam type, the active methylene type and the oxime type blocking agents (see, e.g., U.S. Pat. No. 3,947,426).

In some embodiments, the diisocyanate or isocyanate-functional oligomer or prepolymer is blocked with an aldehyde blocking agent, such as a formyl blocking agent. Examples include but are not limited to 2-formyloxyethyl (meth)acrylate (FEMA) (or other aldehyde-containing acrylate or methacrylate) with a diisocyanate or isocyanate functional oligomer or polymer. See, e.g., X. Tassel et al., *A New Blocking Agent of isocyanates*, European Polymer Journal 36(9), 1745-1751 (2000); T. Haig, P. Badyrka et al., U.S. Pat. No. 8,524,816; and M. Sullivan and D. Bulpett, U.S. Pat. Appl. Pub. No. US20120080824. The reaction product of such an aldehyde blocking agent and an isocyanate can in some embodiments possess an advantage over TBAEMA blocked ABPUs by reducing hydrogen bonding due to urea formation, in turn (in some embodiments) resulting in lower viscosity blocked isocyanates. In addition, in some embodiments, a second advantage is eliminating free amines within the final product (a product of the deblocking of TBAEMA from the ABPU) which might oxidize and cause yellowness or lead to degradation.

In some embodiments, the reactive diluent comprises an acrylate, a methacrylate, a styrene, an acrylic acid, a vinylamide, a vinyl ether, a vinyl ester (including derivatives thereof), polymers containing any one or more of the foregoing, and combinations of two or more of the foregoing. (e.g., acrylonitrile, styrene, divinyl benzene, vinyl toluene, methyl acrylate, ethyl acrylate, butyl acrylate, methyl (meth) acrylate, amine (meth)acrylates as described above, and mixtures of any two or more of these. See, e.g., U.S. Patent Application Publication No. 20140072806.

In some embodiments, the chain extender comprises at least one diol, diamine or dithiol chain extender (e.g., ethylene glycol, 1,3-propanediol, 1,2-propanediol, 1,4-butanediol, 1,5-pentanediol, 1,6-hexanediol, 1,7-heptanediol, 1,8-octanediol, 1,9-nonanediol, 1,10-decanediol, 1,11-undecanediol, 1,12-dodecanediol, 1,2-cyclohexanedimethanol, 1,4-cyclohexanedimethanol, the corresponding diamine and dithiol analogs thereof, lysine ethyl ester, arginine ethyl ester, p-alanine-based diamine, and random or block copolymers made from at least one diisocyanate and at least one diol, diamine or dithiol chain extender. See, e.g., U.S. Patent Application Publication No. 20140010858). Note also that, when dicarboxylic acid is used as the chain extender, polyesters (or carbamate-carboxylic acid anhydrides) are made. Silicone polyamines and silicone polyols may also be employed as chain extenders.

In some embodiments, the polymerizable liquid comprises:

from 5 or 20 or 40 percent by weight to 60 or 80 or 90 percent by weight of the blocked or reactive blocked prepolymer;

from 0 or 0.01 or 1 or 20 percent by weight to 30 or 40 or 50 percent by weight of the reactive diluent;

from 5 or 10 percent by weight to 20 or 30 or 50 or 90 percent by weight of the chain extender; and from 0.01 or 0.1 or 0.2 percent by weight to 1, 2 or 4 percent by weight of the photoinitiator.

Optional additional ingredients, such as dyes, fillers (e.g., silica), surfactants, etc., may also be included, as discussed in greater detail above.

An advantage of some embodiments of the invention is that, because these polymerizable liquids do not rapidly polymerize upon mixing, they may be formulated in advance, and the filling step carried out by feeding or supplying the polymerizable liquid to the build region from a single source (e.g., a single reservoir containing the polymerizable liquid in pre-mixed form), thus obviating the need to modify the apparatus to provide separate reservoirs and mixing capability.

Three-dimensional objects made by the process are, in some embodiments, collapsible or compressible, that is, elastic (e.g., has a Young's modulus at room temperature of from about 0.0001, 0.001, 0.01 or 0.1 gigapascals to about 1, 2 or 4 gigapascals, and/or a tensile strength at maximum load at room temperature of about 0.01, 0.1, or 1 to about 50, 100, or 500 megapascals, and/or a percent elongation at break at room temperature of about 10, 20 50 or 100 percent to 1000, 2000, or 5000 percent, or more).

An additional example of the preparation of a blocked reactive prepolymer is shown in the Scheme below:

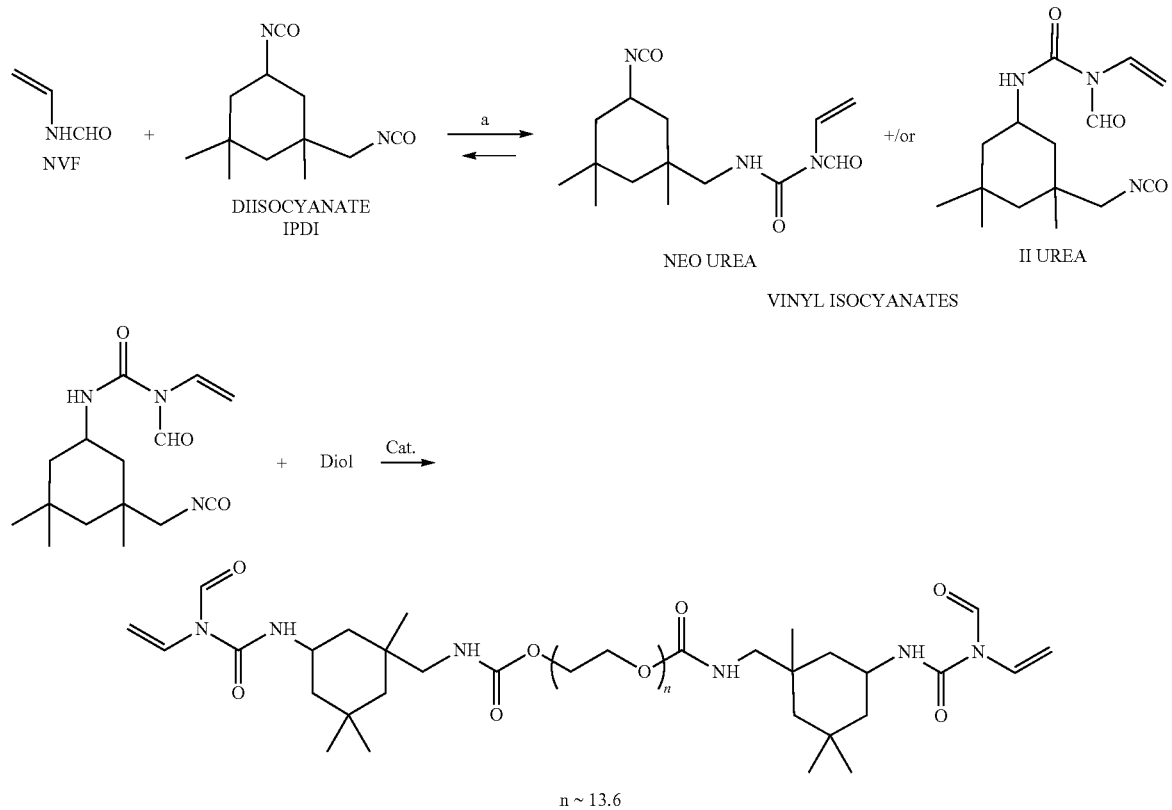

[a] Rate and product split depend on catalyst: Zn Octoate → slow, mainly II Urea; $Sn^{+2}$ → faster, mix.

Note: "Diol" could be polyether based (as drawn) or siloxane or silicone based.

One can use similar chemistry to that described above to form a reactive blocked diioscyanate, a reactive blocked chain extender, or a reactive blocked prepolymer. A non-limiting example of a dual cure system employing a thermally cleavable end group is shown in the Scheme below:

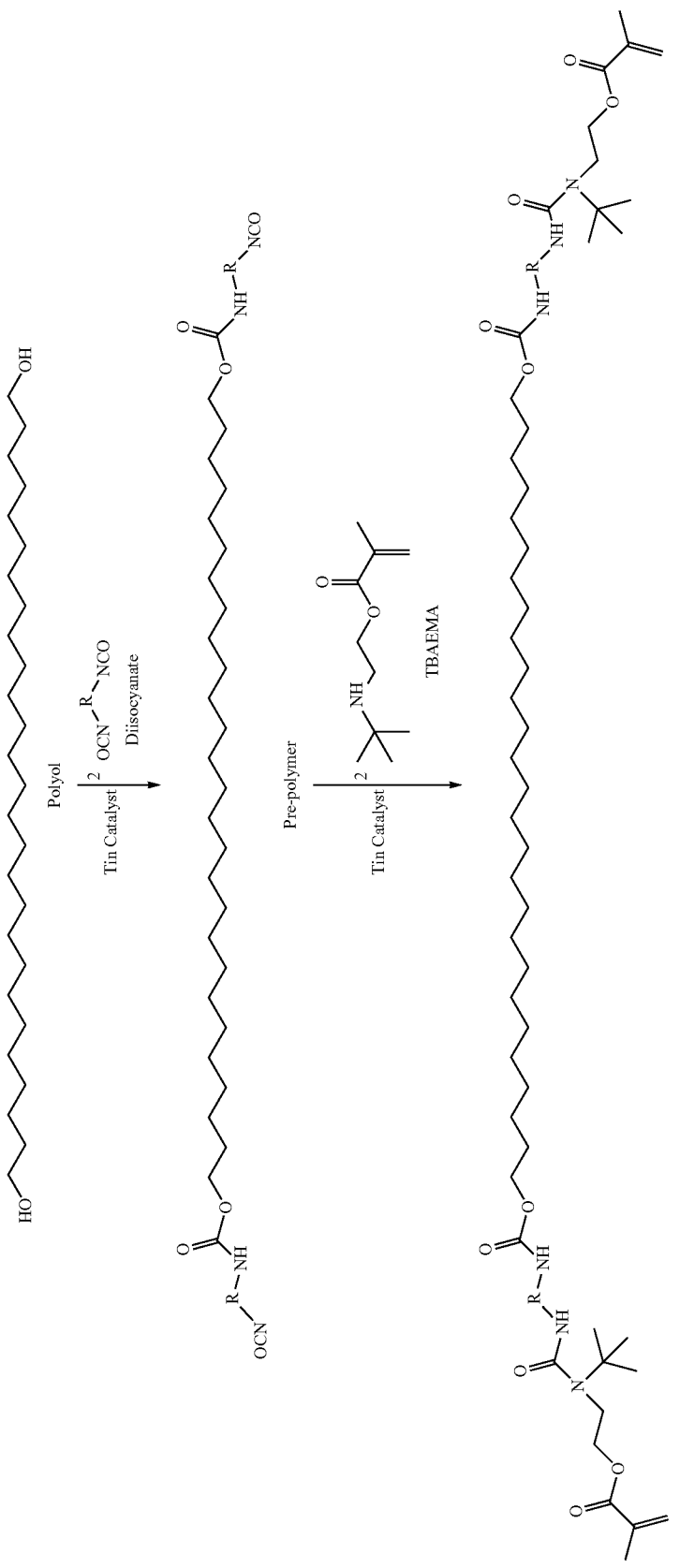

Without wishing to be bound to any underlying mechanism, in some embodiments, during thermal cure, blocking agent is cleaved and diisocyanate prepolymer is re-formed and quickly reacts with chain extenders or additional soft segment to form thermoplastic or thermoset polyurethane, polyurea, or copolymer thereof (e.g., poly(urethane-urea)), as follows:

diethyl malonate, etc.), the illustrative embodiment uses TBAEMA that is commercially available. The used chain extenders can be diols, diamines, triols, triamines or their combinations or others. Ethylene glycol, 1,4-butanediol, methylene dicyclohexylamine (H12MDA; or PACM as the commercial name from Air Products), hydroquinone bis(2-Hydroxyethyl) Ether (HQEE), 4,4'-Methylenebis(3-Chloro-

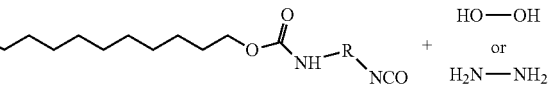

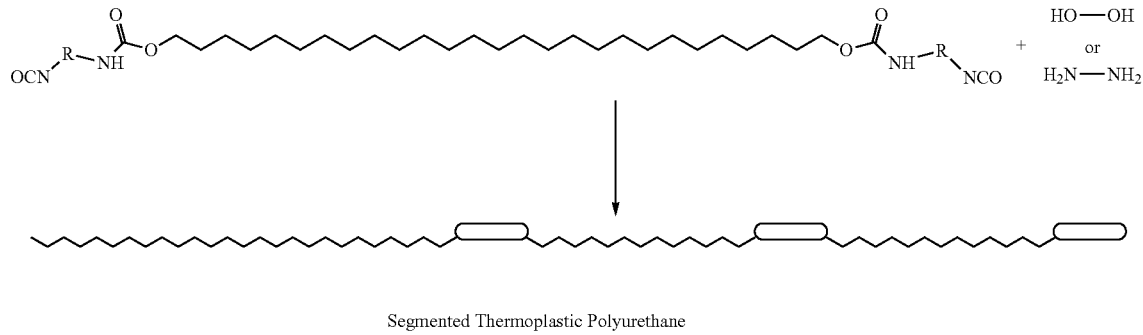

Segmented Thermoplastic Polyurethane

Alternative mechanisms such as those described in section B below may also be implemented or involved.

In the scheme above, the dual cure resin is comprised of a UV-curable (meth)acrylate blocked polyurethane (ABPU), optionally a reactive diluent, a photoinitiator, and a chain extender(s), wherein at least 1 of the components contains a siloxane linkage. The reactive diluent (0-50 wt %) is an acrylate or methacrylate that helps to reduce the viscosity of ABPU and will be copolymerized with the ABPU under UV irradiation.

After UV curing to form a intermediate shaped product having blocked polyurethane oligomers as a scaffold, and carrying the chain extender, the ABPU resin is subjected to a thermal cure, during which a high molecular weight polyurethane/polyurea is formed by a spontaneous reaction between the polyurethane/polyurea oligomers and the chain extender(s). The polyurethane/polyurea oligomer can react with proper chain extenders through substitution of TBAEMA, N-vinylformamide (NVF) or the like by proper chain extenders, either by deblocking or displacement. The thermal cure time needed can vary depending on the temperature, size, shape, and density of the product, but is typically between 1 to 6 hours depending on the specific ABPU systems, chain extenders and temperature.

One advantageous aspect of the foregoing is using a tertiary amine-containing (meth)acrylate (e.g., t-butylaminoethyl methacrylate, TBAEMA) to terminate synthesized polyurethane/polyurea oligomers with isocyanate at both ends. Using acrylate or methacrylate containing hydroxyl groups to terminate polyurethane/polyurea oligomers with isocyanate ends is used in UV curing resins in the coating field. The formed urethane bonds between the isocyanate and hydroxyl groups are generally stable even at high temperatures. In embodiments of the present invention, the urea bond formed between the tertiary amine of TBAEMA and isocyanate of the oligomer becomes labile when heated to suitable temperature (for example, about 100° C.), regenerating the isocyanate groups that will react with the chain extender(s) during thermal-cure to form high molecular weight polyurethane (PU). While it is possible to synthesize other (meth)acrylate containing isocyanate blocking functionality as generally used (such as N-vinylformamide, ε-caprolactam, 1,2,3-triazole, methyl ethyl ketoxime, 2,6-Diethylaniline) (MCDEA), 4,4'-methylene-bis-(2,6 diethylaniline)(MDEA), 4,4'-Methylenebis(2-chloroaniline) (MOCA) are (in some embodiments) the preferred chain extenders. Silicone polyamines (including diamines) and silicone polyols (including diols) may also be employed as chain extenders.

To produce an ABPU, TBAEMA may be used to terminate the isocyanate end groups of the prepolymer, which is derived from isocyanate tipped polyols. The polyols (preferably with hydroxyl functionality of 2) used can be polyethers (especially polytetramethylene oxide (PTMO), polypropylene glycol (PPG)), polyesters (polycaprolactone (PCL), polycarbonate, etc.), polybutadiene, block copolymers such as PCL and PTMO block copolymer (Capa 7201A of Perstop, Inc.), or silicone based (Silmer OH Di-10). The molecular weight of these polyols can be 500 to 6000 Da, and 500-2000 Da are preferred. In the presence of a catalyst (e.g., stannous octoate with 0.1-0.3 wt % to the weight of polyol; other tin catalysts or amine catalysts), diisocyanate (e.g., toluene diisocyanate (TDI), methylene diphenyl diisocyanate (MDI), hexamethylene diisocyanate (HDI), isophorone diisocyanate (IPDI), hydrogenated MDI (HMDI), para-phenyl diisocyanate (PPDI) etc.) is added to the polyol (or the reverse order; preferably the polyol being added to the isocyanate) with certain molar ratio (larger than 1:1; preferably, no less than 2:1 and 2:1 is mostly preferred) to make a prepolymer with residual isocyanate groups (50~100° C.). TBAEMA is then added to the reaction [Note: moles(TBAEMA)*2+moles(OH)=moles(isocyanate)] to cap the remaining isocyanate groups, resulting in ABPU (under 40-70° C.). Radical inhibitors such as hydroquinone (100-500 ppm) can be used to inhibit polymerization of (meth)acrylate during the reaction.

In general, a three-dimensional product of the foregoing methods comprises (i) a linear thermoplastic polyurethane, polyurea, or copolymer thereof (e.g., poly(urethane-urea)), (ii) a cross-linked thermoset polyurethane, polyurea, or copolymer thereof (e.g., poly(urethane-urea)), or (iii) combinations thereof (optionally blended with de-blocked blocking group which is copolymerized with the reactive diluent(s), for example as an interpenetrating polymer network, a semi-interpenetrating polymer network, or as a sequential interpenetrating polymer network).). In some example embodiments, the three-dimensional product may also include unreacted photoinitiator remaining in the three-dimensional formed object. For example, in some embodiments, from 0.1 or 0.2 percent by weight to 1, 2 or 4 percent by weight of the photoinitiator may remain in the three-dimensional formed object or the photoinitiator may be present in lower amounts or only a trace amount. In some example embodiments, the three-dimensional product may also include reacted photoinitiator fragments. For example, in some embodiments, the reacted photoinitiator fragments may be remnants of the first cure forming the intermediate product. For example, from 0.1 or 0.2 percent by weight to 1, 2 or 4 percent by weight of reacted photoinitiator fragments may remain in the three-dimensional formed object or the reacted photoinitiator fragments may be present in lower amounts or only a trace amount. In example embodiments, a three-dimensional product may comprise, consist of or consist essentially of all or any combination of a linear thermoplastic polyurethane, a cross-linked thermoset polyurethane, unreacted photoinitiator and reacted photoinitiator materials.

While this embodiment has been described above primarily with respect to reactive blocking groups, it will be appreciated that unreactive blocking groups may be employed as well.

In addition, while less preferred, it will be appreciated that processes as described above may also be carried out without a blocking agent, while still providing dual cure methods and products of the present invention.

In addition, while this embodiment has been described primarily with diol and diamine chain extenders, it will be appreciated that chain extenders and blocked isocyanates with more than two reactive groups (polyol and polyamine chain extenders such as triols and triamine chain extenders) may be used to form three-dimensional objects comprised of a crosslinked thermoset polyurethane, polyurea, or copolymer thereof (e.g., poly(urethane-urea)).

These materials may be used in bottom-up additive manufacturing techniques such as the continuous liquid interface printing techniques described herein, or other additive manufacturing techniques as noted above and below.

B. Dual hardening polymerizable liquids employing blocked diisocyanates and thermally cleavable blocking groups. Another embodiment provides a method of forming a three-dimensional object comprised of polyurethane, polyurea, or copolymer thereof (e.g., poly(urethane-urea)), the method comprising:
(a) providing a carrier and an optically transparent member having a build surface, the carrier and the build surface defining a build region therebetween;
(b) filling the build region with a polymerizable liquid, the polymerizable liquid comprising a mixture of (i) a blocked or reactive blocked diisocyanate, (ii) optionally a polyol and/or polyamine, (iii) a chain extender, (iv) a photoinitiator, and (v) optionally but in some embodiments preferably a reactive diluent (vi) optionally but in some embodiments preferably a pigment or dye, (vii) optionally but in some embodiments preferably a filler (e.g., silica), and wherein at least one, two, three, or all of the polyol and/or polyamine, the blocked or reactive blocked polyisocyanate chain extender, the one or more additional chain extender, and (less preferably) the reactive diluent, is siloxane-containing.
(c) irradiating the build region with light through the optically transparent member to form a solid blocked diisocyanate scaffold from the blocked diisocyanate, and optionally the reactive diluent and advancing the carrier away from the build surface to form a three-dimensional intermediate having the same shape as, or a shape to be imparted to, the three-dimensional object, with the intermediate containing the chain extender and polyol and/or polyamine; and then
(d) heating or microwave irradiating the three-dimensional intermediate sufficiently (e.g., sufficiently to de-block the blocked diisocyanate and form an unblocked diisocyanate that in turn polymerizes with the chain extender and polyol and/or polyamine) to form the three-dimensional product comprised of polyurethane, polyurea, or copolymer thereof (e.g., poly(urethane-urea)), from the three-dimensional intermediate.

In some embodiments, the blocked or reactive blocked diisocyanate is a compound of the formula A'-X'-A', where X' is a hydrocarbyl group, a siloxane group, or a mixed hydrocarbyl and siloxane group, and each A' is an independently selected substituent of Formula (X'):

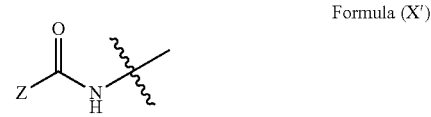

Formula (X')

where Z is a blocking group, the blocking group optionally having a reactive terminal group (e.g., a polymerizable end group such as an epoxy, alkene, alkyne, or thiol end group, for example an ethylenically unsaturated end group such as a vinyl ether). In a particular example, each A' is an independently selected substituent of Formula (XI'):

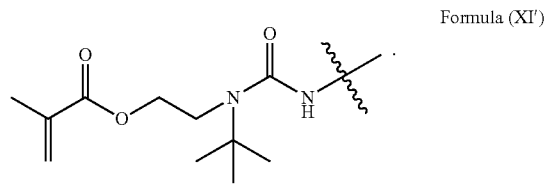 [SMILES: *NC(=O)N(CCOC(=O)C(=C)C)C(C)(C)C]

Formula (XI')

Other constituents and steps of these methods are carried out in like manner as described in section A. above.

In a non-limiting example, a blocked diisocyanate is prepared as shown in the Scheme below. Such blocked diisocyanates may be used in methods described herein.

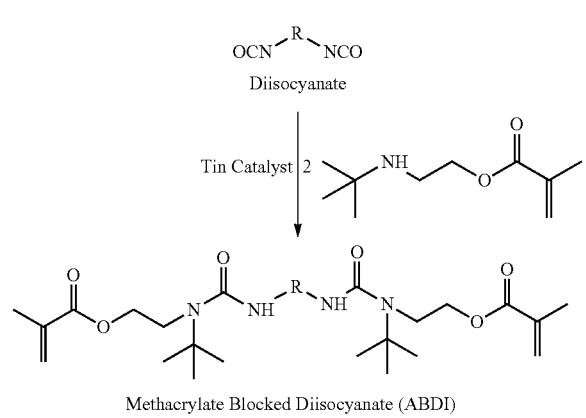

Methacrylate Blocked Diisocyanate (ABDI)

Without wishing to be bound by any particular underlying mechanism, in some embodiments, during thermal cure, the blocking agent is cleaved and the chain extender reacts to form thermoplastic or thermoset polyurethane, polyurea, or a copolymer thereof (e.g., poly(urethane-urea)), for example as shown below:

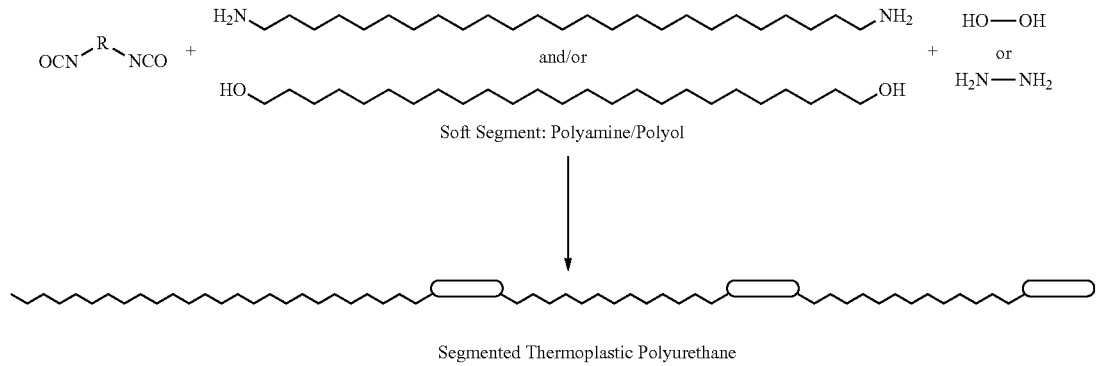

Soft Segment: Polyamine/Polyol

Segmented Thermoplastic Polyurethane

In an alternative mechanism, the chain extender reacts with the blocked diisocyante, eliminates the blocking agent, in the process forming thermoplastic or thermoset polyurethane, polyurea, or a copolymer thereof (e.g., poly(urethane-urea)).

In general, a three-dimensional product of the foregoing methods comprises (i) a linear thermoplastic polyurethane, polyurea, or copolymer thereof (e.g., poly(urethane-urea)), a (ii) cross-linked thermoset polyurethane, polyurea, or copolymer thereof (e.g., poly(urethane-urea)), or (iii) combinations thereof (optionally blended with de-blocked blocking group which is copolymerized with the reactive diluent(s), for example as an interpenetrating polymer network, a semi-interpenetrating polymer network, or as a sequential interpenetrating polymer network). In some example embodiments, the three-dimensional product may also include unreacted photoinitiator remaining in the three-dimensional formed object. For example, in some embodiments, from 0.01 or 0.1 or 0.2 percent by weight to 1, 2 or 4 percent by weight of the photoinitiator may remain in the three-dimensional formed object or the photoinitiator may be present in lower amounts or only a trace amount. In some example embodiments, the three-dimensional product may also include reacted photoinitiator fragments. For example, in some embodiments, the reacted photoinitiator fragments may be remnants of the first cure forming the intermediate product. For example, from 0.01 or 0.1 or 0.2 percent by weight to 1, 2 or 4 percent by weight of reacted photoinitiator fragments may remain in the three-dimensional formed object or the reacted photoinitiator fragments may be present in lower amounts or only a trace amount. In example embodiments, a three-dimensional product may comprise, consist of or consist essentially of all or any combination of a linear thermoplastic polyurethane, a cross-linked thermoset polyurethane, unreacted photoinitiator and reacted photoinitiator materials.

While this embodiment has been described above primarily with respect to reactive blocking groups, it will be appreciated that unreactive blocking groups may be employed as well.

In addition, while less preferred, it will be appreciated that processes as described above may also be carried out without a blocking agent, while still providing dual cure methods and products of the present invention.

In addition, while this embodiment has been described primarily with diol and diamine chain extenders, it will be appreciated that chain extenders with more than two reactive groups (polyol and polyamine chain extenders such as triols and triamine chain extenders) may be used to make three-dimensional objects comprised of a crosslinked thermoset polyurethane, polyurea, or copolymer thereof (e.g., poly(urethane-urea)).

These materials may be used in bottom-up additive manufacturing techniques such as the continuous liquid interface printing techniques described herein, or other additive manufacturing techniques as noted above and below.

C. Dual hardening polymerizable liquids employing blocked chain extenders and thermally cleavable blocking groups. Another embodiment provides a method of forming a three-dimensional object comprised of polyurethane, polyurea, or copolymer thereof (e.g., poly(urethane-urea)), the method comprising:

(a) providing a carrier and an optically transparent member having a build surface, the carrier and the build surface defining a build region therebetween;

(b) filling the build region with a polymerizable liquid, the polymerizable liquid comprising a mixture of (i) a polyol and/or polyamine, (ii) a blocked or reactive blocked diisocyanate chain extender, (iii) optionally one or more additional chain extenders, (iv) a photoinitiator, and (v) optionally but in some embodiments preferably a reactive diluent (vi) optionally but in some embodiments preferably a pigment or dye, (viz) optionally but in some embodiments preferably a filler (e.g., silica), and wherein at least one, two, three, or all of the polyol and/or polyamine, the blocked or reactive blocked polyisocyanate chain extender, the one or more additional chain extender, and (less preferably) the reactive diluent, is siloxane-containing.

(c) irradiating the build region with light through the optically transparent member to form a solid blocked chain diisocyanate chain extender scaffold from the blocked or reactive blocked diisocyanate chain extender and optionally the reactive diluent and advancing the carrier away from the build surface to form a three-dimensional intermediate having the same shape as, or a shape to be imparted to, the three-dimensional object, with the intermediate containing the polyol and/or polyamine and optionally one or more additional chain extenders; and then (d) heating or microwave irradiating the three-dimensional intermediate sufficiently to form the three-dimensional product comprised of polyurethane, polyurea, or copolymer thereof (e.g., poly(urethane-urea)), from the three-dimensional intermediate (e.g., heating or microwave irradiating sufficiently to de-block the blocked diisocyanate chain extender to form an unblocked diisocyanate chain extender that in turn polymerizes with the polyol and/or polyamine and optionally one or more additional chain extenders).

In some embodiments, the blocked or reactive blocked diisocyanate chain extender is a compound of the formula A"-X"-A", where X" is a hydrocarbyl group, a siloxane group, or a mixed hydrocarbyl and siloxane group, and each A" is an independently selected substituent of Formula (X"):

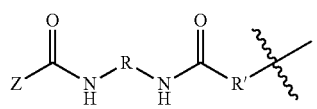

Formula (X")

where R is a hydrocarbyl group, R' is O or NH, and Z is a blocking group, the blocking group optionally having a reactive terminal group (e.g., a polymerizable end group such as an epoxy, alkene, alkyne, or thiol end group, for example an ethylenically unsaturated end group such as a vinyl ether). In a particular example, each A" is an independently selected substituent of Formula (XI"):

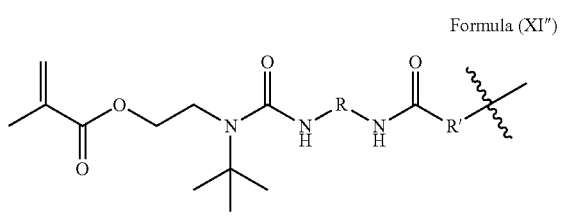

Formula (XI")

where R and R' are as given above.

Other constituents and steps employed in carrying out these methods may be the same as described in section A above.

An example of the preparation of a blocked diol chain extender is shown in the Scheme below.

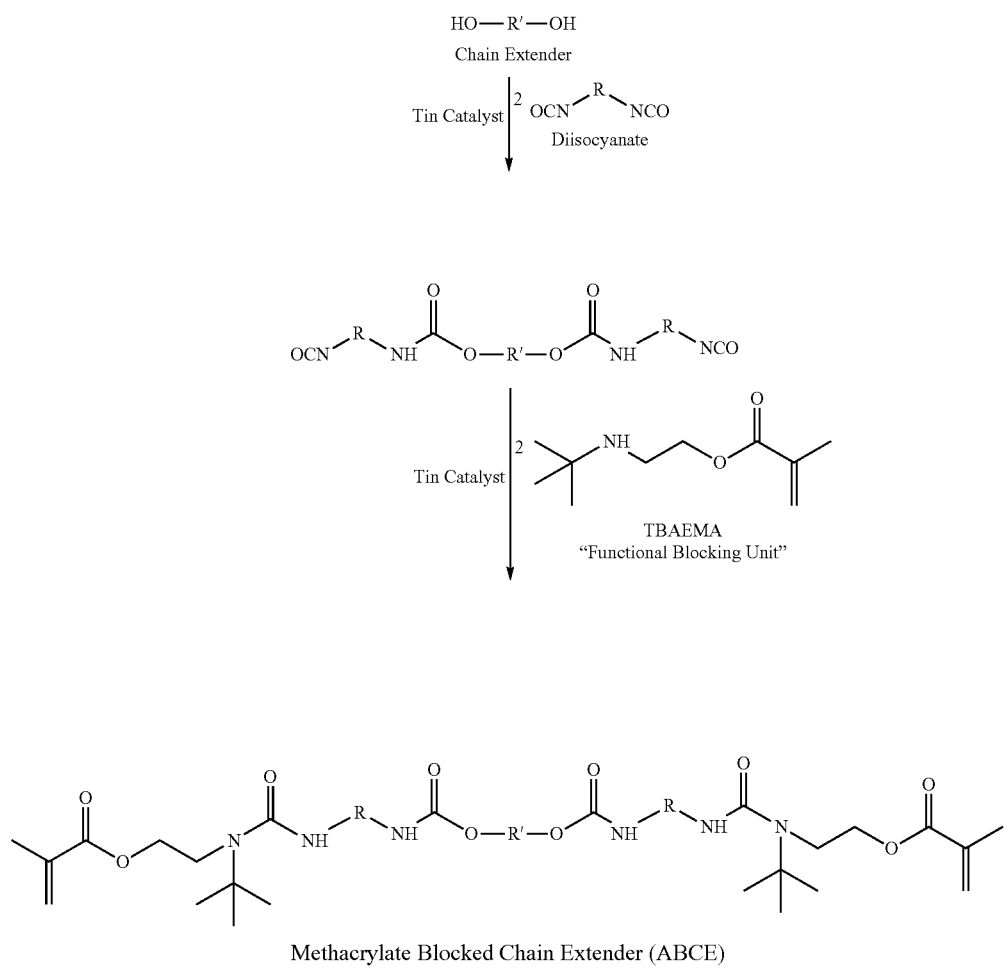

Methacrylate Blocked Chain Extender (ABCE)

An example of the preparation of a blocked diamine chain extender is shown in the Scheme below:

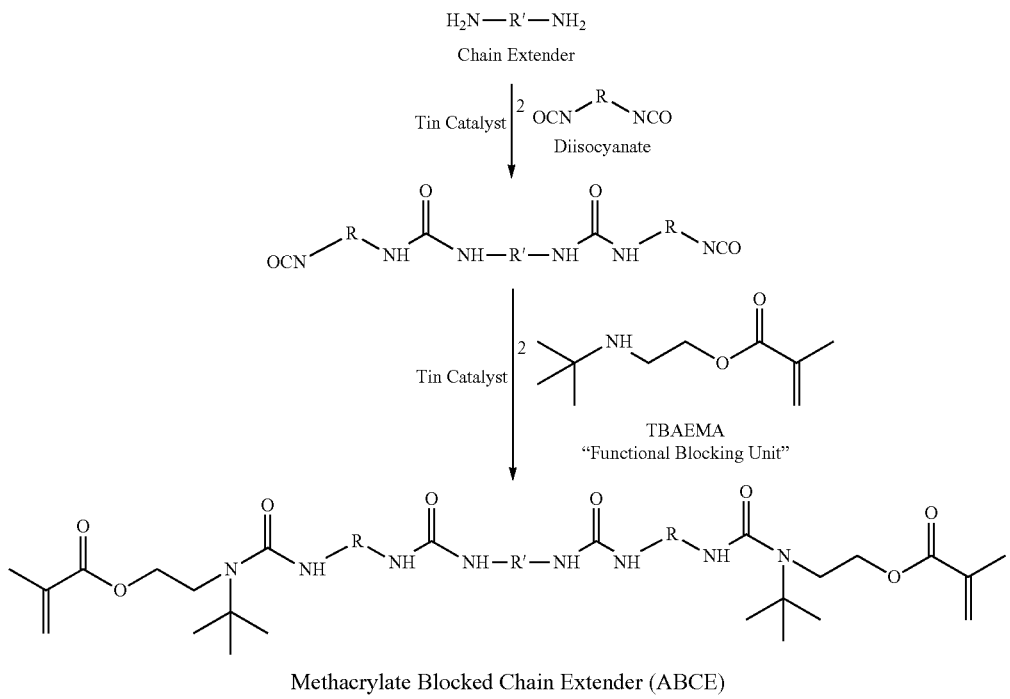

Methacrylate Blocked Chain Extender (ABCE)

Without wishing to be bound to any underlying mechanism of the invention, in some embodiments, during thermal cure, (a) the blocked isocyanate-capped chain extender reacts either directly with soft segment and/or chain extender amine or alcohol groups, displacing the blocking agent; or (b) the blocked isocyanate-capped chain extender is cleaved and diisocyanate-capped chain extender is re-formed and reacts with soft segments and additional chain extender if necessary to yield thermoplastic or thermoset polyurethane, polyurea, or copolymer thereof (e.g., poly(urethane-urea)), such as follows:

In general, a three-dimensional product of the foregoing methods comprises (i) a linear thermoplastic polyurethane, polyurea, or copolymer thereof (e.g., poly(urethane-urea)), (ii) a cross-linked thermoset polyurethane, polyurea, or copolymer thereof (e.g., poly(urethane-urea)), or (iii) combinations thereof (optionally blended with de-blocked blocking group which is copolymerized with the reactive diluent(s), for example as an interpenetrating polymer network, a semi-interpenetrating polymer network, or as a sequential interpenetrating polymer network). In some example embodiments, the three-dimensional product may

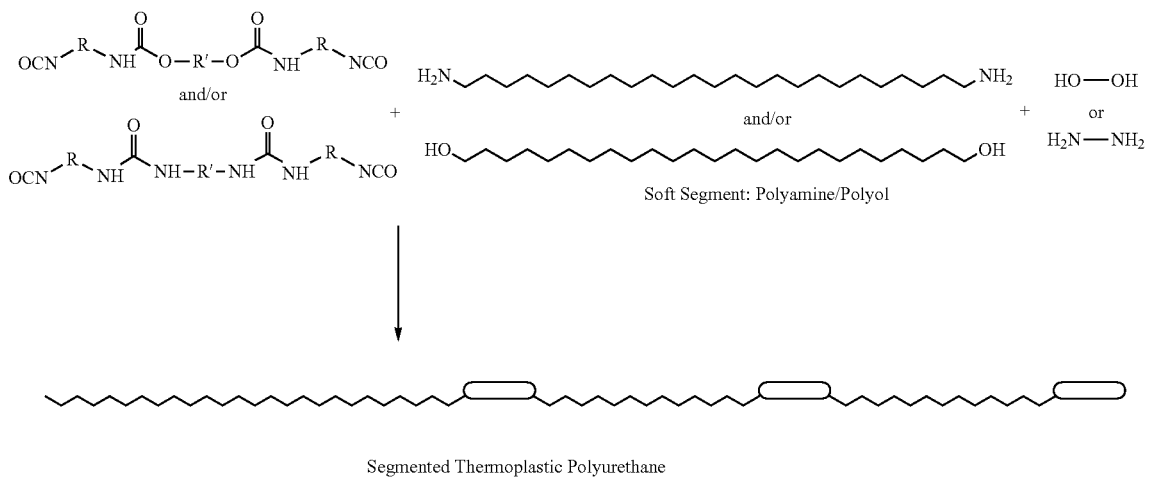

Segmented Thermoplastic Polyurethane

An alternative mechanism analogous to that described in section B above may also be implemented or employed.

also include unreacted photoinitiator remaining in the three-dimensional formed object. For example, in some embodiments, from 0.01 or 0.1 or 0.2 percent by weight to 1, 2 or 4 percent by weight of the photoinitiator may remain in the three-dimensional formed object or the photoinitiator may be present in lower amounts or only a trace amount. In some example embodiments, the three-dimensional product may also include reacted photoinitiator fragments. For example, in some embodiments, the reacted photoinitiator fragments may be remnants of the first cure forming the intermediate product. For example, from 0.01 or 0.1 or 0.2 percent by weight to 1, 2 or 4 percent by weight of reacted photoinitiator fragments may remain in the three-dimensional formed object or the reacted photoinitiator fragments may be present in lower amounts or only a trace amount. In example embodiments, a three-dimensional product may comprise, consist of or consist essentially of all or any combination of a linear thermoplastic polyurethane, a cross-linked thermoset polyurethane, unreacted photoinitiator and reacted photoinitiator materials.

While this embodiment has been described above primarily with respect to reactive blocking groups (that is, blocking groups containing polymerizable moieties), it will be appreciated that unreactive blocking groups may be employed, as well.

In addition, while less preferred, it will be appreciated that processes as described above may also be carried out without a blocking agent, while still providing dual cure methods and products of the present invention.

In addition, while this embodiment has been described primarily with diol and diamine chain extenders, it will be appreciated that chain extenders with more than two reactive groups (polyol and polyamine chain extenders such as triols and triamine chain extenders) may be used to form three-dimensional objects comprised of a crosslinked thermoset polyurethane, polyurea, or copolymer thereof (e.g., poly(urethane-urea)).

Those skilled in the art will appreciate that systems as described in Ying and Cheng, Hydrolyzable Polyureas Bearing Hindered Urea Bonds, *JACS* 136, 16974 (2014), may be used in carrying out the methods described herein.

2. Methods

The three-dimensional intermediate is preferably formed from resins as described above by additive manufacturing, typically bottom-up or top-down additive manufacturing. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, US Patent Application Publication Nos. 2013/0292862 to Joyce and 2013/0295212 to Chen et al., PCT Application Publication No. WO 2015/164234 to Robeson et al., PCT Application Publication No. WO 2016/133759 to Craven et al., and PCT Application Publication No. WO 2016/145182 to Rolland. The disclosures of these patents and applications are incorporated by reference herein in their entirety.

In general, top-down three-dimensional fabrication is carried out by:
  (a) providing a polymerizable liquid reservoir having a polymerizable liquid fill level and a carrier positioned in the reservoir, the carrier and the fill level defining a build region therebetween;
  (b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then
  (c) irradiating the build region with light to form a solid polymer scaffold from the first component and also advancing (typically lowering) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

A wiper blade, doctor blade, or optically transparent (rigid or flexible) window, may optionally be provided at the fill level to facilitate leveling of the polymerizable liquid, in accordance with known techniques. In the case of an optically transparent window, the window provides a build surface against which the three-dimensional intermediate is formed, analogous to the build surface in bottom-up three-dimensional fabrication as discussed below.

In general, bottom-up three-dimensional fabrication is carried out by:
  (a) providing a carrier and an optically transparent member having a build surface, the carrier and the build surface defining a build region therebetween;
  (b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then
  (c) irradiating the build region with light through said optically transparent member to form a solid polymer scaffold from the first component and also advancing (typically raising) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

In some embodiments of bottom-up or top-down three-dimensional fabrication as implemented in the context of the present invention, the build surface is stationary during the formation of the three-dimensional intermediate; in other embodiments of bottom-up three-dimensional fabrication as implemented in the context of the present invention, the build surface is tilted, slid, flexed and/or peeled, and/or otherwise translocated or released from the growing three-dimensional intermediate, usually repeatedly, during formation of the three-dimensional intermediate.

In some embodiments of bottom-up or top-down three-dimensional fabrication as carried out in the context of the present invention, the polymerizable liquid (or resin) is maintained in liquid contact with both the growing three-dimensional intermediate and the build surface during both the filling and irradiating steps, during fabrication of some of, a major portion of, or all of the three-dimensional intermediate.

In some embodiments of bottom-up or top-down three-dimensional fabrication as carried out in the context of the present invention, the growing three-dimensional intermediate is fabricated in a layerless manner (e.g., through multiple exposures or "slices" of patterned actinic radiation or light) during at least a portion of the formation of the three-dimensional intermediate.

In some embodiments of bottom-up or top-down three-dimensional fabrication as carried out in the context of the present invention, the growing three-dimensional intermediate is fabricated in a layer-by-layer manner (e.g., through multiple exposures or "slices" of patterned actinic radiation or light), during at least a portion of the formation of the three-dimensional intermediate.

In some embodiments of bottom-up or top-down three-dimensional fabrication employing a rigid or flexible optically transparent window, a lubricant or immiscible liquid may be provided between the window and the polymerizable liquid (e.g., a fluorinated fluid or oil such as a perfluoropolyether oil).

From the foregoing it will be appreciated that, in some embodiments of bottom-up or top-down three-dimensional fabrication as carried out in the context of the present invention, the growing three-dimensional intermediate is fabricated in a layerless manner during the formation of at least one portion thereof, and that same growing three-dimensional intermediate is fabricated in a layer-by-layer manner during the formation of at least one other portion thereof. Thus, operating mode may be changed once, or on multiple occasions, between layerless fabrication and layer-by-layer fabrication, as desired by operating conditions such as part geometry.

In preferred embodiments, the intermediate is formed by continuous liquid interface production (CLIP). CLIP is known and described in, for example, PCT Applications Nos. PCT/US2014/015486 (published as U.S. Pat. No. 9,211,678 on Dec. 15, 2015); PCT/US2014/015506 (also published as U.S. Pat. No. 9,205,601 on Dec. 8, 2015), PCT/US2014/015497 (also published as U.S. 2015/0097316, and as U.S. Pat. No. 9,216,546 on Dec. 22, 2015), and in J. Tumbleston, D. Shirvanyants, N. Ermoshkin et al., Continuous liquid interface production of 3D Objects, *Science* 347, 1349-1352 (published online 16 Mar. 2015). In some embodiments, CLIP employs features of a bottom-up three-dimensional fabrication as described above, but the the irradiating and/or said advancing steps are carried out while also concurrently maintaining a stable or persistent liquid interface between the growing object and the build surface or window, such as by: (i) continuously maintaining a dead zone of polymerizable liquid in contact with said build surface, and (ii) continuously maintaining a gradient of polymerization zone (such as an active surface) between the dead zone and the solid polymer and in contact with each thereof, the gradient of polymerization zone comprising the first component in partially cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone.

In some embodiments, the stable liquid interface may be achieved by other techniques, such as by providing an immiscible liquid as the build surface between the polymerizable liquid and the optically transparent member, by feeding a lubricant to the build surface (e.g., through an optically transparent member which is semipermeable thereto, and/or serves as a reservoir thereof), etc.

While the dead zone and the gradient of polymerization zone do not have a strict boundary therebetween (in those locations where the two meet), the thickness of the gradient of polymerization zone is in some embodiments at least as great as the thickness of the dead zone. Thus, in some embodiments, the dead zone has a thickness of from 0.01, 0.1, 1, 2, or 10 microns up to 100, 200 or 400 microns, or more, and/or the gradient of polymerization zone and the dead zone together have a thickness of from 1 or 2 microns up to 400, 600, or 1000 microns, or more. Thus the gradient of polymerization zone may be thick or thin depending on the particular process conditions at that time. Where the gradient of polymerization zone is thin, it may also be described as an active surface on the bottom of the growing three-dimensional object, with which monomers can react and continue to form growing polymer chains therewith. In some embodiments, the gradient of polymerization zone, or active surface, is maintained (while polymerizing steps continue) for a time of at least 5, 10, 15, 20 or 30 seconds, up to 5, 10, 15 or 20 minutes or more, or until completion of the three-dimensional product.

Inhibitors, or polymerization inhibitors, for use in the present invention may be in the form of a liquid or a gas. In some embodiments, gas inhibitors are preferred. In some embodiments, liquid inhibitors such as oils or lubricants may be employed. In further embodiments, gas inhibitors which are dissolved in liquids (e.g., oils or lubricants) may be employed. For example, oxygen dissolved in a fluorinated fluid. The specific inhibitor will depend upon the monomer being polymerized and the polymerization reaction. For free radical polymerization monomers, the inhibitor can conveniently be oxygen, which can be provided in the form of a gas such as air, a gas enriched in oxygen (optionally but in some embodiments preferably containing additional inert gases to reduce combustibility thereof), or in some embodiments pure oxygen gas. In alternate embodiments, such as where the monomer is polymerized by photoacid generator initiator, the inhibitor can be a base such as ammonia, trace amines (e.g., methyl amine, ethyl amine, di and trialkyl amines such as dimethyl amine, diethyl amine, trimethyl amine, triethyl amine, etc.), or carbon dioxide, including mixtures or combinations thereof.

The method may further comprise the step of disrupting the gradient of polymerization zone for a time sufficient to form a cleavage line in the three-dimensional object (e.g., at a predetermined desired location for intentional cleavage, or at a location in the object where prevention of cleavage or reduction of cleavage is non-critical), and then reinstating the gradient of polymerization zone (e.g., by pausing, and resuming, the advancing step, increasing, then decreasing, the intensity of irradiation, and combinations thereof).

CLIP may be carried out in different operating modes operating modes (that is, different manners of advancing the carrier and build surface away from one another), including continuous, intermittent, reciprocal, and combinations thereof.

Thus in some embodiments, the advancing step is carried out continuously, at a uniform or variable rate, with either constant or intermittent illumination or exposure of the build area to the light source.

In other embodiments, the advancing step is carried out sequentially in uniform increments (e.g., of from 0.1 or 1 microns, up to 10 or 100 microns, or more) for each step or increment. In some embodiments, the advancing step is carried out sequentially in variable increments (e.g., each increment ranging from 0.1 or 1 microns, up to 10 or 100 microns, or more) for each step or increment. The size of the increment, along with the rate of advancing, will depend in part upon factors such as temperature, pressure, structure of the article being produced (e.g., size, density, complexity, configuration, etc.).

In some embodiments, the rate of advance (whether carried out sequentially or continuously) is from about 0.1 1, or 10 microns per second, up to about to 100, 1,000, or 10,000 microns per second, again depending again depending on factors such as temperature, pressure, structure of the article being produced, intensity of radiation, etc.

In still other embodiments, the carrier is vertically reciprocated with respect to the build surface to enhance or speed the refilling of the build region with the polymerizable liquid. In some embodiments, the vertically reciprocating step, which comprises an upstroke and a downstroke, is carried out with the distance of travel of the upstroke being greater than the distance of travel of the downstroke, to thereby concurrently carry out the advancing step (that is, driving the carrier away from the build plate in the Z dimension) in part or in whole.

In some embodiments, the solidifiable or polymerizable liquid is changed at least once during the method with a subsequent solidifiable or polymerizable liquid (e.g., by switching a "window" or "build surface" and associated reservoir of polymerizable liquid in the apparatus); optionally where the subsequent solidifiable or polymerizable liquid is cross-reactive with each previous solidifiable or polymerizable liquid during the subsequent curing, to form an object having a plurality of structural segments covalently coupled to one another, each structural segment having different structural (e.g., tensile) properties (e.g., a rigid funnel or liquid connector segment, covalently coupled to a flexible pipe or tube segment).

Once the three-dimensional intermediate is formed, it may be removed from the carrier, optionally washed, any supports optionally removed, and then further reacted sufficiently to further cure the resin and form the three-dimensional object.

Washing may be carried out with any suitable organic or aqueous wash liquid, or combination thereof, including solutions, suspensions, emulsions, microemulsions, etc. Examples of suitable wash liquids include, but are not limited to water, alcohols (e.g., methanol, ethanol, isopropanol, etc.), benzene, toluene, etc. Such wash solutions may optionally contain additional constituents such as surfactants, etc. A currently preferred wash liquid is isopropanol. Wash methods such as those described in U.S. Pat. No. 5,248,456 may be employed and are included therein.

Such further reacting may be by heating the intermediate, microwave irradiating the intermediate, contacting the intermediate to moisture, e-beam irradiating the intermediate, irradiating the intermediate with light at a different wavelength than the light of step, irradiating said intermediate with light at the same wavelength as but at greater intensity than the light of step, or a combination thereof.

In some embodiments, a heating step is carried out at one (oven) temperature. In other embodiments, a heating step is carried out at at least a first (oven) temperature and a second (oven) temperature, with the first temperature greater than ambient temperature, the second temperature greater than the first temperature, and the second temperature less than 300° C. (e.g., with ramped or step-wise increases between ambient temperature and the first temperature, and/or between the first temperature and the second temperature).

For example, the intermediate may be heated in a stepwise manner at a first temperature of about 70° C. to about 150° C., and then at a second temperature of about 150° C. to 200 or 250° C., with the duration of each heating depending on the size, shape, and/or thickness of the intermediate. In another embodiment, the intermediate may be cured by a ramped heating schedule, with the temperature ramped from ambient temperature through a temperature of 70 to 150° C., and up to a final temperature of 250 or 300° C., at a change in heating rate of 0.5° C. per minute, to 5° C. per minute. See, e.g., U.S. Pat. No. 4,785,075.

Note that, where multiple light steps are employed (i.e., where the three-dimensional intermediate is exposed to light to produce the product), the spectra of the light for each step may overlap in whole or in part, but intensity and/or range of spectra may be varied, depending upon the absorption characteristics of the pertinent initiator and/or sensitizer used in the composition, to optimize activation of a particular reaction.

It will be clear to those skilled in the art that the materials described in the current invention will be useful in other additive manufacturing techniques, including ink-jet printer-based methods.

3. Products

Products produced from the resins and methods described above include products for which biocompatibility is a desired attribute, such as, among other things, cosmetic, reconstructive and prosthetic surgical implants (e.g., facial implants, including chin, ear, nose, lip, and orbital implants, etc.), breast implants, etc., including body part mimetics (e.g., reproduction or mimetics of hand, foot, face, etc., including portions or subcomponents thereof), base sockets for prosthetic limbs, joint replacements (e.g., for fingers and toes), sclera buckles for the treatment of retinal disease, drains (e.g., for glaucoma therapy), tubes for ear drainage (myringotomy), vaginal rings (e.g., for drug release), implantable valves (e.g., for hydrocephaly drains), fallopian tube plugs, gastric bands, breathing masks such as continuous positive airway pressure (CPAP) masks, seals and septa for medicinal or vascular access ports; urological catheters, headers for implantable devices such as defibrillators, pacemakers and cardioverters, oxygen-permeable bandages, contact lenses, intraocular implants, etc.

In addition, products produced from the resins and methods described above include products for which clarity/light transmissivity, resilience, and/or temperature tolerance are desired attributes, including light fixtures and elements such as lenses, waveguides, light housings, and the like (e.g., for LED, incandescent, fluorescent, and luminescent light sources, etc.).

In addition, products produced from the resins and methods described above include products for which good rebound properties or resilience is desired, such as protective housings for electronic devices, springs (e.g., as a portion of an electrical sensor), shock absorbers, multi-material fluid or hydraulic actuators (soft robotic devices), etc.

In addition, products produced from the resins and methods described above include products for which damping properties are desired, such as vibrational isolators for electronic devices, impact isolators and noise isolators.

In addition, products produced from the resins and methods described above include products for which solvent and chemical resistance is a desired attribute, such as microfluidic devices, chromatography stationary phase devices (e.g., for gas chromatography), etc.

In addition, products produced from the resins and methods described above include products for which a wide temperature range of operation is a desired attribute, such as gaskets, vent ducts, etc.

Moulds (molds) or dies for casting or molding may be produced from the resins and methods described above, including but not limited to spin-casting molds, injection molding molds, and molds for other types of processes. The molds may be used to form or cast materials such as ice and food products (both in home kitchen and industrial food manufacturing applications), as well as molds for forming objects from other resins, foams, rubber, metals (particularly low-temperature alloys), etc.

Additional products that can be produced from the resins and methods described herein include, but are not limited to, commercial and household cookware (knives, forks, spoons, spatulas, molds, steamers, poachers, lids, pads, mats, potholders, trivets, ice-cube trays, etc.).

Embodiments of the present invention are explained in greater detail in the following non-limiting examples. In the Examples set forth below, the following reagents are used, except where indicated otherwise.

Example 1

Synthesis of a Reactive Blocked Silicone-Based Polyurethane Prepolymer for Dual Cure 150 g of dried, 1,000 Da PDMS-based silicone-diol (Silmer OH Di-10) is added to a 500 mL 3-neck flask charged with an overhead stirrer and a thermometer. 50.5 g of hexamethylene diisocyanate (HDI) is added dropwise to the flask and stirred with the silicone-diol for 10 min, followed by addition of 100 uL of the Tin(II) catalyst stannous octoate. The temperature is raised to 70° C., and the reaction is stirred for 3 h. After 3 h, the temperature is gradually lowered to 40° C., 100 ppm hydroquinone is added, and 56 g of tert-butylaminoethyl methacrylate (TBAEMA) is gradually added using an additional funnel over 20 min. The temperature is set to 50° C. and the reaction is stirred for 14 h. Pour out the final liquid as the product.

In this example, the silicone-diol can be replaced by other diols or polyols including polytetramethylene oxide (PTMO, such as 1000 Da PTMO (PTMO1k)), polypropylene glycol (PPG, such as 1000 Da PPG (PPG1k)), other polyesters or polybuadiene diols. The silicone-diol can also be replaced by diamines or polyamines that are silicone-based or non-silicone-based (PDMS diamine, such as 900 Da PDMS-based Silmer NH Di-8; or PTMO or PPG-based diamine, such as Jeffamine THF-100). HDI can be replaced by other diisocyanates or polyisocyanates. The molar stoichiometry of the polyol:diisocyanate:TBAEMA is preferably 1:2:2. Preferably use 0.1-0.3 wt % stannous octoate to the weight of the polyol.

Example 2

Synthesis of a Reactive Blocked Silicone-Based Polyurethane Prepolymer for Dual Cure Add 200 g dried 4,300 Da, PDMS-based silicone-diisocyanate (Silmer NCO Di-50) into a 500 mL 3-neck flask charged with an overhead stirrer, 100 ppm hydroquinone, and a thermometer. Gradually add 17.3 g TBAEMA using an additional funnel within 20 min while the reaction is vessel is at 40° C. Then set the temperature to 50° C. and keep the reaction going on for 14 h. Pour out the final liquid as the product.

In this example, the silicone-diisocyanate can be replaced by other siloxane or hydrocarbyl-based diisocyanates or polyisocyanates. The molar stoichiometry of the diisocyanate:TBAEMA is preferably 1:2.

Example 3

Elastomer from a Reactive Blocked Silicone-Based Polyurethane Prepolymer

Components as shown in Table 1 are added to a container and thoroughly mixed (either by an overhead stirrer or a centrifugation mixer such as THINKY™ mixer) to obtain a homogeneous resin. The resin is formed by CLIP, as described above, into D638 Type IV dog-bone-shaped specimens followed by thermal curing at 120° C. for 2 h. The cured elastomer specimens could then be tested following ASTM standard D638-10 on an Instron apparatus for mechanical properties.

TABLE 1

| | Parts by weight |
|---|---|
| ABPU (Silmer OH Di-10 + HDI + TBAEMA) | 60 |
| Silmer ACR Di-25 (linear PDMS-based silicone diacrylate) | 29 |
| Silmer NH Di-8 (linear PDMS-based silicone diamine) | 10 |
| PPO | 1 |

Example 4

Synthesis of a Reactive Blocked Silicone-Based Polyurethane Prepolymer for Dual Cure 444.60 g of isophorone diisocyanate (IPDI) was added to a 2 L 4-neck flask charged with an overhead stirrer, an addition funnel, a reflux condenser, a thermometer and 0.91 g stannous octoate. 1,000 g of 1,000 Da PDMS-based silicone-diol (Silmer OH Di-10) was added dropwise to the flask over 4 hours as the reaction contents stir at 70° C. The reaction was slowly cooled to 60° C. over 1 h while stirring, before 0.18 g of monomethyl ether hydroquinone (MEHQ) was added to the reaction contents. 370.60 g of tert-butylaminoethyl methacrylate (TBAEMA) was added to the reaction contents dropwise over 1.5 h, and the reaction continued to stir for 12 h at 60° C. The prepolymer product was collected as a liquid.

The viscosity of the prepolymer was 43,000 cP @25° C.

Example 5

Synthesis of a Reactive Blocked Silicone-Based Polyurethane Prepolymer for Dual Cure 207.76 g of isophorone diisocyanate (IPDI) was added to a 2 L 4-neck flask charged with an overhead stirrer, an addition funnel, a reflux condenser, a thermometer and 0.69 g stannous octoate. 1,000 g of 2,000 Da PDMS-based silicone-diol (Silmer OH Di-25) was added dropwise to the flask over 4 hours as the reaction contents stir at 70° C. The reaction was slowly cooled to 60° C. over 1 h while stirring, before 0.14 g of monomethyl ether hydroquinone (MEHQ) was added to the reaction contents. 173.18 g of tert-butylaminoethyl methacrylate (TBAEMA) was added to the reaction contents dropwise over 1.5 h, and the reaction continued to stir for 12 h at 60° C. The prepolymer product was collected as a liquid.

The viscosity of the prepolymer was 8,000 cP @25° C.

Example 6

Synthesis of a Reactive Blocked Silicone-Based Polyurethane Prepolymer for Dual Cure 52.80 g of isophorone diisocyanate (IPDI) was added to a 1 L 4-neck flask charged with an overhead stirrer, an addition funnel, a reflux condenser, a thermometer and 0.29 g stannous octoate. 475 g of 4,000 Da PDMS-based silicone-diol (Silmer OH Di-50) was added dropwise to the flask over 4 hours as the reaction contents stir at 70° C. The reaction was slowly cooled to 60° C. over 1 h while stirring, before 0.06 g of monomethyl ether hydroquinone (MEHQ) was added to the reaction contents. 44.01 g of tert-butylaminoethyl methacrylate (TBAEMA) was added to the reaction contents dropwise over 1.5 h, and the reaction continued to stir for 12 h at 60° C. The prepolymer product was collected as a liquid.

The viscosity of the prepolymer was 3,400 cP @25° C.

Example 7

Synthesis of a Reactive Blocked Silicone-Based Polyurethane Prepolymer for Dual Cure 218.22 g of 4,4'-methylenebis(cyclohexyl isocyanate) (HMDI) was added to a 2 L 4-neck flask charged with an overhead stirrer, an addition funnel, a reflux condenser, a thermometer and 0.63 g stannous octoate. 890 g of 2,100 Da PDMS-based silicone-diol (Silmer OH Di-25) was added dropwise to the flask over 4 hours as the reaction contents stir at 70° C. The reaction was slowly cooled to 60° C. over 1 h while stirring, before 0.13 g of monomethyl ether hydroquinone (MEHQ) was added to the reaction contents. 154.13 g of tert-butylaminoethyl methacrylate (TBAEMA) was added to the reaction contents dropwise over 1.5 h, and the reaction continued to stir for 12 h at 60° C. The prepolymer product was collected as a liquid.

The viscosity of the prepolymer was 21,400 cP @25° C.

Example 8

Synthesis of a Reactive Blocked Silicone-Based Polyurethane Prepolymer for Dual Cure 302.76 g of hexamethylene diisocyanate (HDI) was added to a 2 L 4-neck flask charged with an overhead stirrer, an addition funnel, a reflux condenser, a thermometer and 0.77 g stannous octoate. 900 g of 1,000 Da PDMS-based silicone-diol (Silmer OH Di-10) was added dropwise to the flask over 4 hours as the reaction contents stir at 70° C. The reaction was slowly cooled to 60° C. over 1 h while stirring, before 0.15 g of monomethyl ether hydroquinone (MEHQ) was added to the reaction contents. 333.54 g of tert-butylaminoethyl methacrylate (TBAEMA) was added to the reaction contents dropwise over 1.5 h, and the reaction continued to stir for 12 h at 60° C. The prepolymer product was collected as a liquid.

The viscosity of the prepolymer was 4,700 cP @25° C.

Example 9

Synthesis of a Reactive Blocked Silicone-Based Polyurethane Prepolymer for Dual Cure 333.45 g of isophorone diisocyanate (IPDI) was added to a 2 L 4-neck flask charged with an overhead stirrer, an addition funnel, a reflux condenser, a thermometer and 0.60 g stannous octoate. 500 g of 1,000 Da PDMS-based silicone-diol (Silmer OH Di-10) was added dropwise to the flask over 4 hours as the reaction contents stir at 70° C. The reaction was slowly cooled to 60° C. over 1 h while stirring, before 0.12 g of monomethyl ether hydroquinone (MEHQ) was added to the reaction contents. 370.60 g of tert-butylaminoethyl methacrylate (TBAEMA) was added to the reaction contents dropwise over 1.5 h, and the reaction continued to stir for 12 h at 60° C. The prepolymer product was collected as a liquid.

The viscosity of the prepolymer was greater than 100,000 cP @25° C.

Example 10

Synthesis of a Reactive Blocked Silicone-Based Polyurethane Prepolymer for Dual Cure 444.26 g of isophorone diisocyanate (IPDI) was added to a 2 L 4-neck flask charged with an overhead stirrer, an addition funnel, a reflux condenser, a thermometer and 0.80 g stannous octoate. 700 g of 1,000 Da PDMS-based silicone-diol (Silmer OH Di-10) was added dropwise to the flask over 4 hours as the reaction contents stir at 70° C. The reaction was slowly cooled to 60° C. over 1 h while stirring, before 0.16 g of monomethyl ether hydroquinone (MEHQ) was added to the reaction contents. 466.33 g of tert-butylaminoethyl methacrylate (TBAEMA) was added to the reaction contents dropwise over 1.5 h, and the reaction continued to stir for 12 h at 60° C. The prepolymer product was collected as a liquid.

The viscosity of the prepolymer was greater than 100,000 cP @25° C.

Example 11

The prepolymer described in Example 8 (71.82 g), Jeffamine T-403 (5.64 g, from Hunstman Corp), Jeffamine THF-100 (21.04 g, from Huntsman Corp) and ethyl(2,4,6-trimethylbenzoyl)phenylphosphinate (TPO-L, 1.50 g, from Esstech Inc) were combined in a THINKY™ mixer for 2 minutes at 2000 rpm. The homogenous solution was loaded into a continuous liquid interface production (CLIP) additive manufacturing printer and ultraviolet curing produced a three-dimensional intermediate. The three-dimensional intermediate was then thermally cured at 120° C. for 3 hours to produce the final silicone rubber product. Parts by weight and tensile properties (as determined by an INSTRON testing apparatus, 50 mm/min strain rate) for printed bar specimens (100 mm×9 mm×2.6 mm) are given in Table 2 below.

TABLE 2

|  | Parts by weight |
|---|---|
| Prepolymer (Example 8) | 71.82 |
| Jeffamine T-403 | 5.64 |
| Jeffamine THF-100 | 21.04 |
| TPO-L | 1.50 |
| Tensile strength at break (MPa) | 0.40 ± 0.02 |
| % Elongation at break | 255 ± 8 |
| Modulus (MPa) | 0.25 ± 0.01 |

Example 12

The prepolymer described in Example 4 (68.25 g), Jeffamine T-403 (5.90 g, from Hunstman Corp), Jeffamine THF-170 (24.25 g, from Huntsman Corp), ethyl(2,4,6-trimethylbenzoyl)phenylphosphinate (TPO-L, 1.50 g, from Esstech Inc) and 2-isopropylthioxanthone (ITX, 0.10 g, Esstech Inc) were combined in a THINKY™ mixer for 5 minutes at 2000 rpm. The homogenous solution was loaded into a continuous liquid interface production (CLIP) additive manufacturing printer and ultraviolet curing produced a three-dimensional intermediate. The three-dimensional intermediate was then thermally cured at 120° C. for 4 hours to produce the final silicone rubber product. Parts by weight and tensile properties (as determined by an INSTRON testing apparatus, 50 mm/min strain rate) for printed bar specimens (100 mm×9 mm×2.6 mm) are given in Table 3 below.

TABLE 3

|  | Parts by weight |
| --- | --- |
| Prepolymer (Example 4) | 68.25 |
| Jeffamine T-403 | 5.90 |
| Jeffamine THF-170 | 24.25 |
| TPO-L | 1.50 |
| ITX | 0.10 |
| Tensile strength at break (Mpa) | 1.71 ± 0.11 |
| % Elongation at break | 418 ± 2 |
| Modulus (MPa) | 1.11 ± 0.03 |
| Shore A Hardness (6 mm thick sample) | 40 |

Example 13

The prepolymer described in Example 8 (86.34 g), 4,4'-methylenebis(2-methylcyclohexyl amine) (MACM, 12.06 g, from DKSH North America Inc), ethyl(2,4,6-trimethylbenzoyl)phenylphosphinate (TPO-L, 1.50 g, from Esstech Inc) and 2-isopropylthioxanthone (ITX, 0.10 g, Esstech Inc) were combined in a THINKY™ mixer for 4 minutes at 2000 rpm. The homogenous solution was loaded into a continuous liquid interface production (CLIP) additive manufacturing printer and ultraviolet curing produced a three-dimensional intermediate. The three-dimensional intermediate was then thermally cured at 120° C. for 2 hours to produce the final silicone rubber product. Parts by weight and tensile properties (as determined by an INSTRON testing apparatus, 50 mm/min strain rate) for printed bar specimens (100 mm×9 mm×2.6 mm) are given in Table 4 below.

TABLE 4

|  | Parts by weight |
| --- | --- |
| Prepolymer (Example 8) | 86.34 |
| MACM | 12.06 |
| TPO-L | 1.50 |
| ITX | 0.10 |
| Tensile strength at break (Mpa) | 3.09 ± 0.25 |
| % Elongation at break | 236 ± 33 |
| Modulus (MPa) | 5.48 ± 0.23 |
| Shore A Hardness (6 mm thick sample) | 70 |

Example 14

The prepolymer described in Example 10 (37.93 g), Silmer OH ACR Di-100 (3.00 g, 8,000 Da PDMS-based diacrylate, from Siltech Corp), Jeffamine T-403 (1.59 g, Huntsman Corp), Jeffamine T-3000 (29.88 g, from Hunstman Corp), Jeffamine D-2000 (15.95 g, from Hunstman Corp), Aerosil R-8200 (10.00 g, hydrophobic fumed silica, from Evonik Industries), ethyl(2,4,6-trimethylbenzoyl)phenylphosphinate (TPO-L, 1.50 g, from Esstech Inc) and 2-isopropylthioxanthone (ITX, 0.10 g, Esstech Inc) were mixed with an overhead mixer for 5 minutes at 1,500 rpms and then degassed in a THINKY™ mixer for 2 minutes at 2,200 rpm. The homogenous solution was loaded into a continuous liquid interface production (CLIP) additive manufacturing printer and ultraviolet curing produced a three-dimensional intermediate. The three-dimensional intermediate was then thermally cured at 120° C. for 3 hours to produce the final silicone rubber product. Parts by weight and tensile properties (as determined by an INSTRON testing apparatus, 50 mm/min strain rate) for printed bar specimens (100 mm×9 mm×2.6 mm) are given in Table 5 below.

TABLE 5

|  | Parts by weight |
| --- | --- |
| Prepolymer (Example 10) | 37.93 |
| Silmer OH ACR Di-100 | 3.00 |
| Jeffamine T-403 | 1.59 |
| Jeffamine T-3000 | 29.88 |
| Jeffamine D-2000 | 15.95 |
| Aerosil R-8200 | 10.00 |
| TPO-L | 1.50 |
| ITX | 0.10 |
| Tensile strength at break (Mpa) | 3.38 ± 0.16 |
| % Elongation at break | 490 ± 15 |
| Modulus (MPa) | 1.11 ± 0.03 |
| Shore A Hardness (6 mm thick sample) | 29 |

Example 15

The prepolymer described in Example 5 (58.73 g), AMS-162 (35.20 g, PDMS-based polyamine with an average of 3.8 amines/molecule and an average molecular weight of 4,500 Da, from Gelest), Silmer NH Di-8 (4.47 g, PDMS-based diamine with an average molecular weight of 900 Da, from Siltech Corp), ethyl(2,4,6-trimethylbenzoyl)phenylphosphinate (TPO-L, 1.50 g, from Esstech Inc) and 2-isopropylthioxanthone (ITX, 0.10 g, Esstech Inc) were combined in a THINKY™ mixer for 4 minutes at 2000 rpm. The homogenous solution was loaded into a continuous liquid interface production (CLIP) additive manufacturing printer and ultraviolet curing produced a three-dimensional intermediate. The three-dimensional intermediate was then thermally cured at 120° C. for 2 hours to produce the final silicone rubber product. Parts by weight and tensile properties (as determined by an INSTRON testing apparatus, 50 mm/min strain rate) for printed bar specimens (100 mm×9 mm×2.6 mm) are given in Table 6 below.

TABLE 6

|  | Parts by weight |
| --- | --- |
| Prepolymer (Example 5) | 58.73 |
| AMS-162 | 35.20 |
| Silmer NH Di-8 | 4.47 |
| TPO-L | 1.50 |
| ITX | 0.10 |
| Tensile strength at break (Mpa) | 0.70 ± 0.06 |
| % Elongation at break | 130 ± 15 |
| Modulus (MPa) | 0.76 ± 0.12 |
| Shore A Hardness (6 mm thick sample) | 23 |

Example 16

The prepolymer described in Example 4 (42.06 g), Jeffamine T-3000 (46.34 g, from Hunstman Corp), Aerosil R-709 (10.00 g, hydrophobic fumed silica, from Evonik Industries), ethyl(2,4,6-trimethylbenzoyl)phenylphosphinate (TPO-L, 1.50 g, from Esstech Inc) and 2-isopropylthioxanthone (ITX, 0.10 g, Esstech Inc) were combined in a THINKY™ mixer for 30 minutes at 2000 rpm. The homogenous solution was loaded into a continuous liquid interface production (CLIP) additive manufacturing printer and ultraviolet curing produced a three-dimensional intermediate. The three-dimensional intermediate was then thermally cured at 120° C. for 3 hours to produce the final silicone rubber product. Parts by weight and tensile properties (as determined by an INSTRON testing apparatus, 50 mm/min strain rate) for printed bar specimens (100 mm×9 mm×2.6 mm) are given in Table 7 below.

TABLE 7

|  | Parts by weight |
| --- | --- |
| Prepolymer (Example 4) | 42.06 |
| Jeffamine T-3000 | 46.34 |
| Aerosil R-709 | 10.00 |
| TPO-L | 1.50 |
| ITX | 0.10 |
| Tensile strength at break (Mpa) | 1.51 ± 0.10 |
| % Elongation at break | 305 ± 15 |
| Modulus (MPa) | 0.99 ± 0.11 |
| Shore A Hardness (6 mm thick sample) | 33 |

Example 17

The prepolymer described in Example 10 (35.68 g), Jeffamine T-3000 (52.73 g, from Hunstman Corp), Aerosil R-9200 (10.00 g, hydrophobic fumed silica, from Evonik Industries), ethyl(2,4,6-trimethylbenzoyl)phenylphosphinate (TPO-L, 1.50 g, from Esstech Inc) and 2-isopropylthioxanthone (ITX, 0.10 g, Esstech Inc) were combined in a THINKY™ mixer for 30 minutes at 2000 rpm. The homogenous solution was loaded into a continuous liquid interface production (CLIP) additive manufacturing printer and ultraviolet curing produced a three-dimensional intermediate. The three-dimensional intermediate was then thermally cured at 120° C. for 3 hours to produce the final silicone rubber product. Parts by weight and tensile properties (as determined by an INSTRON testing apparatus, 50 mm/min strain rate) for printed bar specimens (100 mm×9 mm×2.6 mm) are given in Table 8 below. Tear strength specimens were printed and cured as rectangular slabs (120 mm×50 mm×2 mm) and then die cure with a Type C die, per ASTM D624.

TABLE 8

|  | Parts by weight |
| --- | --- |
| Prepolymer (Example 10) | 35.68 |
| Jeffamine T-3000 | 52.73 |
| Aerosil R-9200 | 10.00 |
| TPO-L | 1.50 |
| ITX | 0.10 |
| Tensile strength at break (Mpa) | 2.69 ± 0.17 |
| % Elongation at break | 253 ± 13 |
| Modulus (MPa) | 2.12 ± 0.04 |
| Shore A Hardness (6 mm thick sample) | 45 |
| Tear strength (kN/m) | 12.72 ± 0.65 |

The foregoing is illustrative of the present invention, and is not to be construed as limiting thereof. The invention is defined by the following claims, with equivalents of the claims to be included therein.

We claim:

1. A polymerizable liquid useful for the production of a three-dimensional object comprised of a silicone polymer or a copolymer thereof by additive manufacturing, said polymerizable liquid comprising a mixture of:
   (a) from 5 to 90 percent by weight of a blocked or reactive blocked siloxane-containing prepolymer,
   (b) from 5 to 90 percent by weight of a chain extender,
   (c) from 0.01 to 4 percent by weight of a photoinitiator,
   (d) optionally a polyol and/or a polyamine,
   (e) optionally a reactive diluent,
   (f) optionally, a light absorbing pigment or dye in an amount of from 0.001 to 10 percent by weight, and
   (g) optionally a filler.

2. The polymerizable liquid of claim 1, wherein said pigment or dye is present and is:
   (i) titanium dioxide,
   (ii) carbon black, and/or
   (iii) an organic ultraviolet light absorber.

3. The polymerizable liquid of claim 1, wherein said blocked or reactive blocked siloxane-containing prepolymer is a compound of the formula A-X-A, where X is a siloxane group, or a mixed hydrocarbyl and siloxane group, and each A is an independently selected substituent of Formula (X):

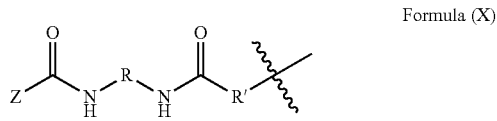

Formula (X)

wherein R is a hydrocarbyl group, R' is O or NH, and Z is a blocking group, said blocking group optionally having a reactive terminal group.

4. The polymerizable liquid of claim 1, wherein said blocked or reactive blocked siloxane-containing prepolymer comprises a polyisocyanate;
   and/or said reactive blocked prepolymer comprises two or more ethylenically unsaturated end groups.

5. The polymerizable liquid of claim 1, wherein said blocked or reactive blocked siloxane-containing prepolymer comprises a polyisocyanate oligomer produced by the reaction of at least one polyisocyanate with at least one polyol or polyamine.

6. The polymerizable liquid of claim 1, wherein said siloxane-containing prepolymer is a reactive blocked siloxane-containing prepolymer blocked by reaction of a polyisocyanate oligomer with an alcohol (meth)acrylate, amine (meth)acrylate, maleimide, or n-vinylformamide monomer blocking agent.

7. The polymerizable liquid of claim 1, wherein said reactive diluent is present and comprises an acrylate, a methacrylate, a styrene, an acrylic acid, a vinylamide, a vinyl ether, a vinyl ester, polymers containing any one or more of the foregoing, or a combination of two or more of the foregoing.

8. The polymerizable liquid of claim 1, wherein said chain extender comprises at least one diol, diamine or dithiol chain extender.

9. The polymerizable liquid of claim 1, wherein said polymerizable liquid comprises:
   from 20 to 60 percent by weight of said blocked or reactive blocked siloxane-containing prepolymer;
   from 10 to 50 percent by weight of said chain extender; and
   from 1 to 40 percent by weight of said reactive diluent.

10. A polymerizable liquid useful for the production of a three-dimensional object comprised of a silicone polymer or a copolymer thereof by additive manufacturing, said polymerizable liquid comprising a mixture of:
(a) a blocked or reactive blocked siloxane-containing polyisocyanate,
(b) optionally a polyol and/or polyamine,
(c) a chain extender,
(d) a photoinitiator,
(e) optionally a reactive diluent,
(f) optionally a pigment or dye, and
(g) optionally a filler.

11. The polymerizable liquid of claim 10, further comprising:
(h) a blocked or reactive blocked, optionally siloxane-containing, diisocyanate prepolymer.

12. The polymerizable liquid of claim 10, wherein said pigment or dye is present and is a light absorbing pigment or dye in an amount of from 0.001 to 10 percent by weight.

13. The polymerizable liquid of claim 12, wherein said pigment or dye is:
(i) titanium dioxide,
(ii) carbon black, and/or
(iii) an organic ultraviolet light absorber.

14. The polymerizable liquid of claim 10, wherein said blocked or reactive blocked siloxane-containing polyisocyanate is a compound of the formula A'-X'-A', where X' is a siloxane group, or a mixed hydrocarbyl and siloxane group, and each A' is an independently selected substituent of Formula (X'):

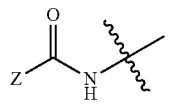

Formula (X')

wherein Z is a blocking group, said blocking group optionally having a reactive terminal group.

15. The polymerizable liquid of claim 14, wherein each A' is a substituent of Formula (XI'):

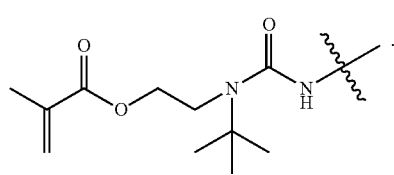

Formula (XI')

16. The polymerizable liquid of claim 10, wherein said blocked or reactive blocked siloxane-containing polyisocyanate is blocked by reaction of a polyisocyanate with an alcohol (meth)acrylate, amine (meth)acrylate, maleimide, or n-vinylformamide monomer blocking agent.

17. The polymerizable liquid of claim 10, wherein said reactive diluent is present and comprises an acrylate, a methacrylate, a styrene, an acrylic acid, a vinylamide, a vinyl ether, a vinyl ester, polymers containing any one or more of the foregoing, or a combination of two or more of the foregoing.

18. The polymerizable liquid of claim 10, wherein said chain extender comprises at least one diol, diamine or dithiol chain extender.

19. The polymerizable liquid of claim 10, wherein said polymerizable liquid comprises:

from 5 to 90 percent by weight of said blocked or reactive blocked siloxane-containing polyisocyanate,
optionally, from 5 to 90 percent by weight of said polyol or polyamine,
optionally, from 1 to 40 percent by weight of said reactive diluent,
from 5 to 30 percent by weight of said chain extender,
from 0.1 to 4 percent by weight of said photoinitiator,
from 0.1 to 2 percent by weight of said pigment or dye when present, and
from 1 to 50 percent by weight of said filler when present.

20. A polymerizable liquid useful for the production of a three-dimensional object comprised of a silicone polymer or a copolymer thereof by additive manufacturing, said polymerizable liquid comprising a mixture of:
(a) a polyol and/or polyamine,
(b) a blocked or reactive blocked siloxane-containing polyisocyanate chain extender,
(c) optionally one or more additional chain extenders,
(d) a photoinitiator,
(e) optionally a reactive diluent,
(f) optionally a pigment or dye, and
(g) optionally a filler.

21. The polymerizable liquid of claim 20, further comprising:
(h) a blocked or reactive blocked diisocyanate prepolymer, and/or a blocked or reactive blocked polyisocyanate.

22. The polymerizable liquid of claim 20, wherein said pigment or dye is present and is a light absorbing pigment or dye in an amount of from 0.001 to 10 percent by weight.

23. The polymerizable liquid of claim 22, wherein said pigment or dye is:
(i) titanium dioxide,
(ii) carbon black, and/or
(iii) an organic ultraviolet light absorber.

24. The polymerizable liquid of claim 20, wherein said blocked or reactive blocked siloxane-containing polyisocyanate chain extender is a compound of the formula A"-X"-A", where X" is a siloxane group, or a mixed hydrocarbyl and siloxane group, and each A" is an independently selected substituent of Formula (X"):

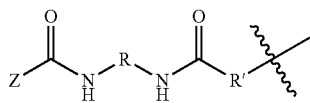

Formula (X")

wherein R is a hydrocarbyl group, R' is O or NH, and Z is a blocking group, said blocking group optionally having a reactive terminal group.

25. The polymerizable liquid of claim 20, wherein said blocked or reactive blocked siloxane-containing polyisocyanate chain extender comprises a polyisocyanate oligomer produced by the reaction of at least one polyisocyanate with at least one chain extender.

26. The polymerizable liquid of claim 20, wherein said reactive blocked siloxane-containing chain extender is blocked by reaction of a polyisocyanate oligomer with an alcohol (meth)acrylate, amine (meth)acrylate, maleimide or n-vinylformamide monomer blocking agent.

27. The polymerizable liquid of claim 20, wherein said reactive diluent is present and comprises an acrylate, a methacrylate, a styrene, an acrylic acid, a vinylamide, a vinyl ether, a vinyl ester, polymers containing any one or more of the foregoing, or a combination of two or more of the foregoing.

28. The polymerizable liquid of claim 20, wherein said polymerizable liquid comprises:
   from 5 to 90 percent by weight of said polyol or polyamine,
   from 5 to 90 percent by weight of said blocked or reactive blocked siloxane-containing polyisocyanate chain extender,
   optionally, from 1 to 40 percent by weight of said reactive diluent,
   from 5 to 30 percent by weight of said chain extender,
   from 0.1 to 4 percent by weight of said photoinitiator,
   from 0.01 to 2 percent by weight of said pigment or dye when present, and
   from 1 to 50 percent by weight of said filler when present.

29. The polymerizable liquid of claim 3, wherein each A is an independently selected substituent of Formula (XI):

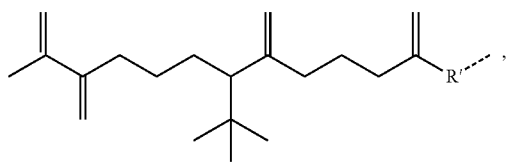

wherein R and R' are as provided in claim 3.